US010490477B2

(12) United States Patent
Sagong et al.

(10) Patent No.: US 10,490,477 B2
(45) Date of Patent: Nov. 26, 2019

(54) SEMICONDUCTOR DEVICE

(71) Applicant: Samsung Electronics Co., Ltd., Suwon-si, Gyeonggi-do (KR)

(72) Inventors: Hyun-Chul Sagong, Hwasung (KR); Sang-Woo Pae, Seongnam-si (KR); Seung-Jin Choo, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 430 days.

(21) Appl. No.: 15/168,242

(22) Filed: May 30, 2016

(65) Prior Publication Data

US 2017/0018479 A1 Jan. 19, 2017

(30) Foreign Application Priority Data

Jul. 16, 2015 (KR) ........................ 10-2015-0100841

(51) Int. Cl.

*H01L 23/373* (2006.01)
*H01L 23/367* (2006.01)
*H01L 27/092* (2006.01)
*H01L 29/06* (2006.01)
*H01L 29/423* (2006.01)
*H01L 29/66* (2006.01)

(Continued)

(52) U.S. Cl.

CPC ........ *H01L 23/367* (2013.01); *H01L 23/3731* (2013.01); *H01L 23/3738* (2013.01); *H01L 27/092* (2013.01); *H01L 29/0673* (2013.01); *H01L 29/42392* (2013.01); *H01L 29/66439* (2013.01); *H01L 29/66772* (2013.01);

(Continued)

(58) Field of Classification Search

CPC ..... Y10S 977/938; H01L 29/0669–068; H01L 23/367; H01L 29/42392; H01L 23/32–49; H01L 23/3738; H01L 23/34–38; H01L 21/18–32; H01L 27/1203; H01L 29/0673

See application file for complete search history.

(56) References Cited

U.S. PATENT DOCUMENTS 6,740,910 B2 5/2004 Roesner et al.
7,960,235 B1 6/2011 Song et al.

(Continued)

OTHER PUBLICATIONS

Jackson et al. High-Thermal-Conductivity Aluminum Nitride Ceramics: The Effect of Thermodynamic, Kinetic, and Microstructural Factors. J. Am. Ceram. Soc., 80 1421-35 (1997).*

*Primary Examiner* — Eric A. Ward
*Assistant Examiner* — Eric K Ashbahian
(74) *Attorney, Agent, or Firm* — Renaissance IP Law Group LLP

(57) ABSTRACT

A semiconductor device includes a substrate, a thermal conduction layer on the substrate, a first wire pattern on the thermal conduction layer, a first semiconductor pattern a second semiconductor pattern, and a gate electrode between the first semiconductor pattern and the second semiconductor pattern. The gate electrode surrounds a periphery of the first wire pattern. A concentration of impurity of the thermal conduction layer is different from that of the substrate. The first wire pattern includes a first end and a second end. The concentration of impurity contained in the first wire pattern is higher than that contained in the thermal conduction layer and that contained in the substrate. The first semiconductor pattern is in contact with the first end of the first wire pattern and the thermal conduction layer. The second semiconductor pattern is in contact with the second end of the first wire pattern.

14 Claims, 46 Drawing Sheets

1

145 B C 140 A A B C 112a 111 110 105 100 Z1 Y1 X1

(51) Int. Cl.

| | |
|---|---|
| ***H01L 29/775*** | (2006.01) |
| ***H01L 29/786*** | (2006.01) |
| *B82Y 10/00* | (2011.01) |
| *H01L 27/02* | (2006.01) |

(52) U.S. Cl.

CPC ...... *H01L 29/775* (2013.01); *H01L 29/78603* (2013.01); *H01L 29/78654* (2013.01); *H01L 29/78684* (2013.01); *H01L 29/78696* (2013.01); *B82Y 10/00* (2013.01); *H01L 27/0211* (2013.01); *H01L 29/66469* (2013.01)

(56) References Cited

U.S. PATENT DOCUMENTS

| | | | | |
|---|---|---|---|---|
| 8,022,447 | B2 | 9/2011 | Bjoerk et al. | |
| 8,518,769 | B2 | 8/2013 | Ota et al. | |
| 8,637,849 | B2 | 1/2014 | Deligianni et al. | |
| 2005/0236670 | A1* | 10/2005 | Chien | H01L 21/743 257/347 |
| 2007/0298551 | A1 | 12/2007 | Bouvet et al. | |
| 2011/0012199 | A1* | 1/2011 | Nygaard | H01L 21/84 257/347 |
| 2013/0001655 | A1* | 1/2013 | Huang | H01L 23/38 257/256 |
| 2013/0299771 | A1* | 11/2013 | Youn | H01L 21/845 257/9 |
| 2013/0307200 | A1* | 11/2013 | Carberry | C04B 35/64 264/614 |
| 2015/0053928 | A1 | 2/2015 | Ching et al. | |
| 2015/0060767 | A1 | 3/2015 | Xiao et al. | |
| 2015/0090958 | A1 | 4/2015 | Yang et al. | |

* cited by examiner 1
140
145
112a
111
110
105
100
A
B
C
Y1
X1
Z1

180
140
105
100
A
120a
135
125
120
130
112a
111
112b
110
120b
Line1
145
A

6

SEMICONDUCTOR DEVICE

CROSS-REFERENCE TO RELATED APPLICATION

This application claims priority from Korean Patent Application No. 10-2015-0100841 filed on Jul. 16, 2015 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device and a method for fabricating the same, and more particularly, to a semiconductor device comprising a wire pattern and a fabricating method thereof.

2. Description of the Related Art

For semiconductor device density enhancement, the multigate transistor has been suggested as one of the scaling technologies. A multi-channel active pattern (or silicon body) in a fin or nanowire shape is formed on a substrate, with gates formed on a surface of the multi-channel active pattern.

The multigate transistor allows easy scaling, as it uses a three-dimensional channel. Further, current control capability can be enhanced without increasing a gate length of the multigate transistor. Furthermore, it is possible to effectively suppress short channel effect (SCE) which is the phenomenon that the electric potential of the channel region is influenced by the drain voltage.

SUMMARY

The present disclosure provides a semiconductor device which can provide enhanced operational performance and reliability, by facilitating heat dissipation from a transistor.

The present disclosure also provides a method for fabricating a semiconductor device which can provide enhanced operational performance and reliability, by facilitating heat dissipation from a transistor.

A semiconductor device may include a substrate, a thermal conduction layer on the substrate, a first wire pattern on the thermal conduction layer, a first semiconductor pattern, a second semiconductor pattern, and a gate electrode between the first semiconductor pattern and the second semiconductor pattern. The gate electrode surrounds a periphery of the first wire pattern. A concentration of impurity of the thermal conduction layer is different from a concentration of impurity of the substrate. The first wire pattern includes a first end and a second end. The concentration of impurity contained in the first wire pattern is higher than the concentration of impurity contained in the thermal conduction layer and the concentration impurity contained in the substrate. The first semiconductor pattern is in contact with the first end of the first wire pattern and the thermal conduction layer, and the second semiconductor pattern in contact with the second end of the first wire pattern.

Another semiconductor device may include a substrate, a thermal conduction layer on the substrate, a first semiconductor pattern on the thermal conduction layer, a second semiconductor pattern on the thermal conduction layer, a wire pattern between the first semiconductor pattern and the second semiconductor pattern, and a gate electrode on the thermal conduction layer. The gate electrode surrounds a periphery of the wire pattern. The thermal conduction layer includes a plate and a first protrusion protruding from the plate. A concentration of impurity of the thermal conduction layer is different from a concentration of impurity of the substrate. The first semiconductor pattern contacts the first protrusion, and the second semiconductor pattern is spaced apart from the first semiconductor pattern. The wire pattern extends longitudinally from one direction. The concentration of impurity contained in the wire pattern is higher than the concentration of impurity contained in the thermal conduction layer and the concentration of impurity contained in the substrate.

Also, other semiconductor device may include a substrate comprising a first region in which an NMOS is formed and a second region in which a PMOS is formed, a first transistor being formed on the first region and comprising a first thermal conduction layer being on the substrate, a first wire pattern being on the first thermal conduction layer and comprising a first end and a second end, a first semiconductor pattern being in contact with the first end of the first wire pattern and the first thermal conduction layer, a second semiconductor pattern being in contact with the second end of the first wire pattern, a first gate electrode surrounding the first wire pattern, a second transistor being formed on the second region and comprising a second thermal conduction layer being on the substrate, a second wire pattern being on the second thermal conduction layer and comprising a third end and a fourth end, a third semiconductor pattern being in contact with the third end of the second wire pattern and the second thermal conduction layer, a fourth semiconductor pattern being in contact with the fourth end of the second wire pattern, and a second gate electrode surrounding the second wire pattern. The concentration of impurity contained in the first wire pattern is higher than the concentration of impurity contained in the first thermal conduction layer and the concentration of impurity contained in the substrate. The concentration of impurity contained in the second wire pattern is higher than the concentration of impurity contained in the second thermal conduction layer and the concentration of impurity contained in the substrate. A concentration profile of impurity contained in the first thermal conduction layer is different from the concentration profile of impurity contained in the second thermal conduction layer.

The present disclosure are not limited to those mentioned above, and other disclosures that are not mentioned above can be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Figure 1:
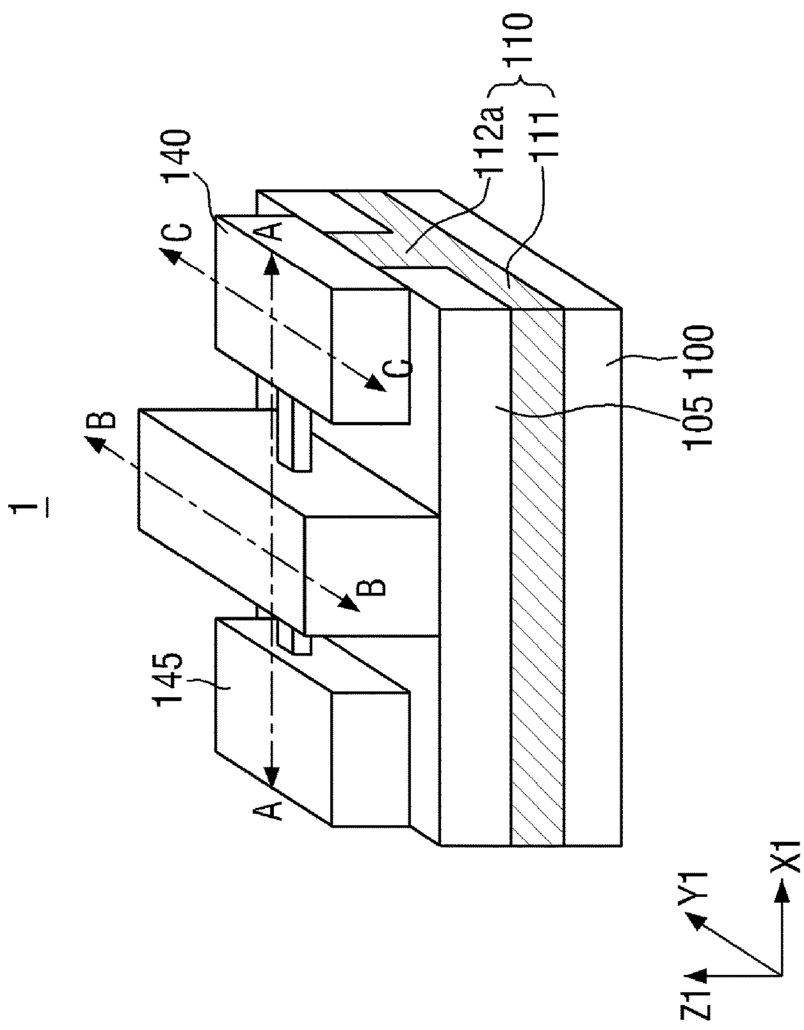
FIG. 1 is a perspective view provided to explain a semiconductor device according to a first example embodiment.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the disclosure (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

The present disclosure will be described with reference to perspective views, cross-sectional views, and/or plan views, in which preferred embodiments of the disclosure are shown. Thus, the profile of an example view may be modified according to manufacturing techniques and/or allowances. That is, the embodiments of the disclosure are not intended to limit the scope of the present disclosure but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this disclosure belongs. It is noted that the use of any and all examples, or example terms provided herein is intended merely to better illuminate the disclosure and is not a limitation on the scope of the disclosure unless otherwise specified. Further, unless defined otherwise, all terms defined in generally used dictionaries may not be overly interpreted.

Hereinbelow, a semiconductor device according to the first example embodiment will be explained with reference to FIGS. 1 to 5.

Figure 2:
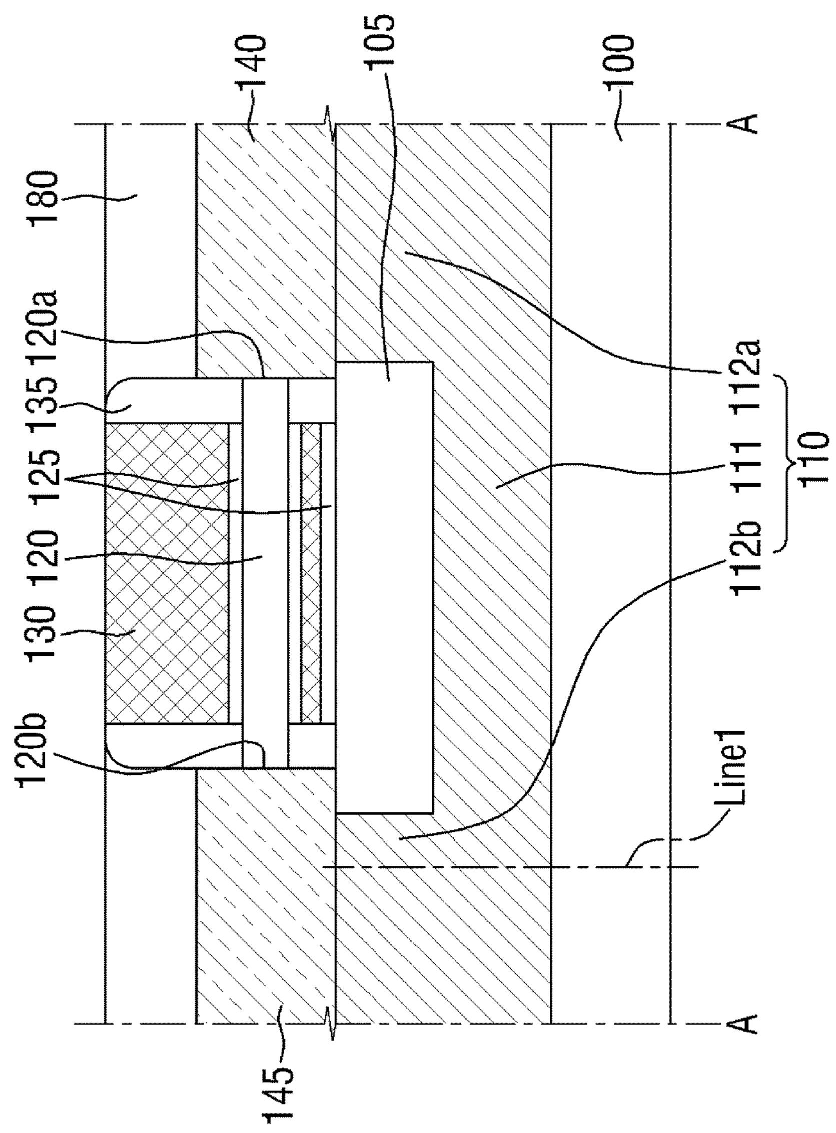
FIG. 2 is a cross sectional view taken on line A-A of FIG. 1.
Figure 3:
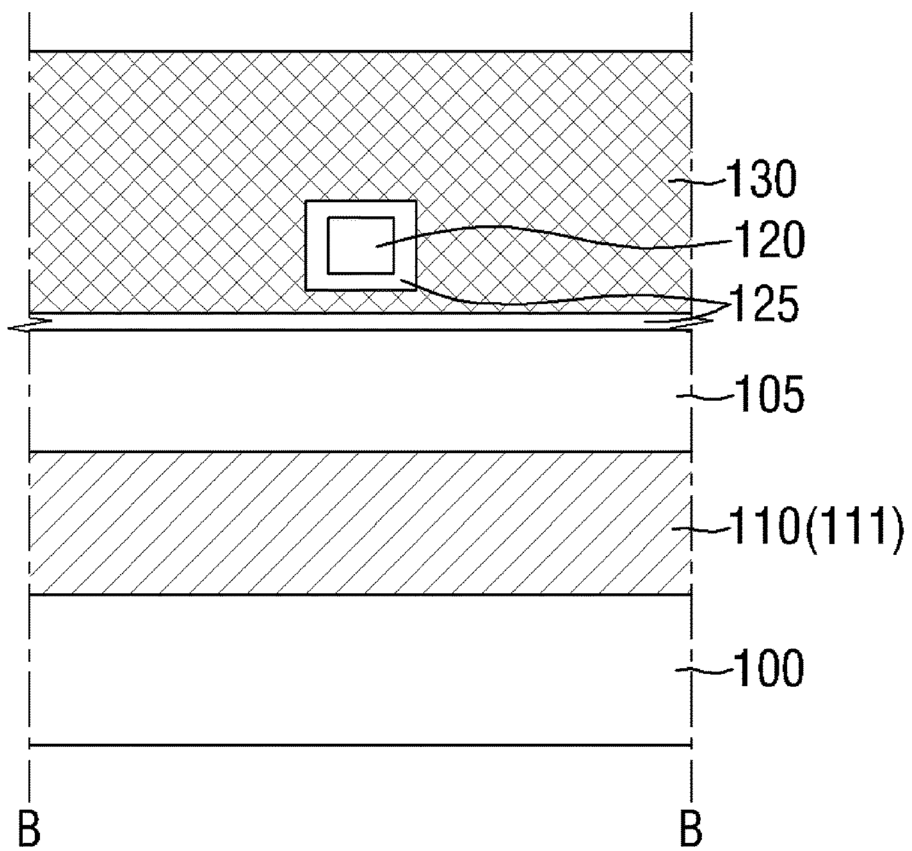
FIG. 3 is a cross sectional view taken on line B-B of FIG. 1.
Figure 4:
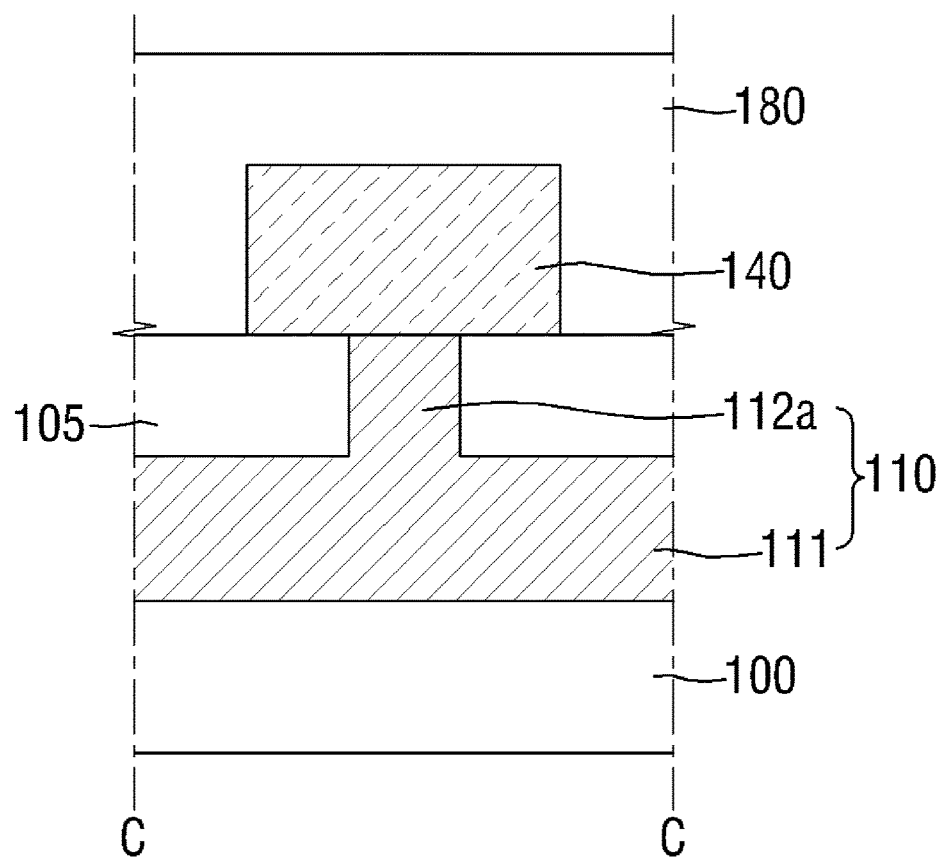
FIG. 4 is a cross sectional view taken on line C-C of FIG. 1.
Figure 5:
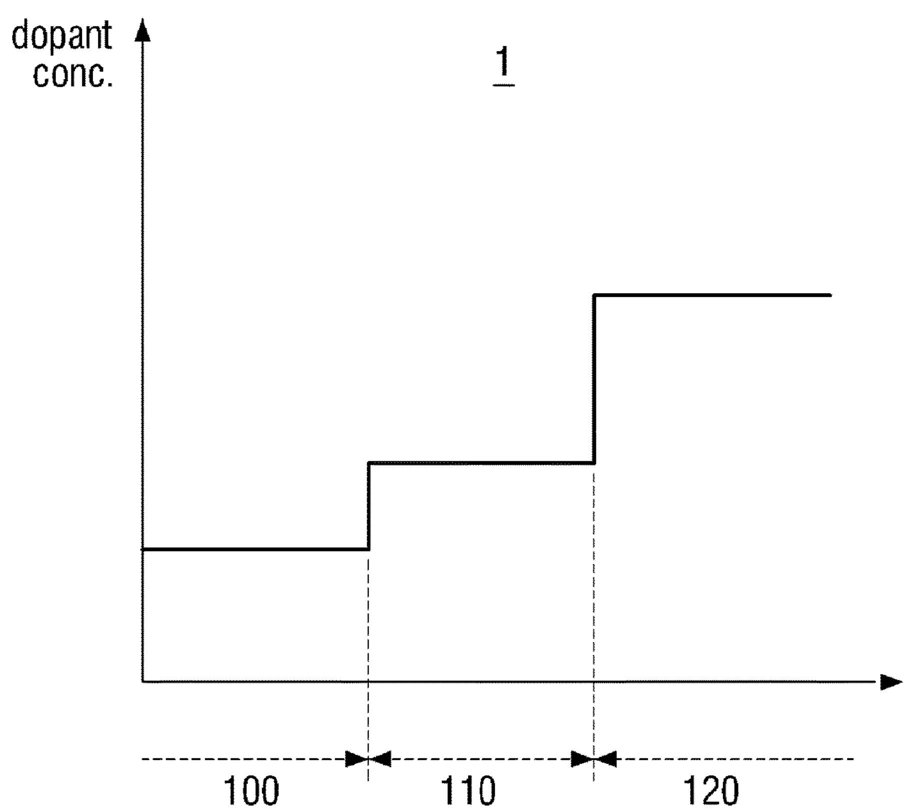
FIG. 5 is a schematic view illustrating an impurity concentration of the wire pattern of FIG. 2 and an impurity concentration of a thermal conduction layer along Line 1.

FIG. 1 is a perspective view provided to explain a semiconductor device according to a first example embodiment. FIG. 2 is a cross sectional view taken on line A-A of FIG. 1. FIG. 3 is a cross sectional view taken on line B-B of FIG. 1. FIG. 4 is a cross sectional view taken on line C-C of FIG. 1. FIG. 5 is a schematic view illustrating an impurity concentration of the wire pattern of FIG. 2 and an impurity concentration of a thermal conduction layer along Line 1.

For convenience of explanation, FIG. 1 skips illustration of an interlayer insulating film 180.

Referring to FIGS. 1 to 5, a semiconductor device 1 according to the first example embodiment may include a first thermal conduction layer 110, a first wire pattern 120, a first semiconductor pattern 140, and a second semiconductor pattern 145.

The substrate 100 may be a bulk silicon or a silicon-on-insulator (SOI), for example. Alternatively, the substrate 100 may be a silicon substrate, or may include other substance such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

For convenience of explanation, it is assumed in the following description that the substrate 100 is a silicon substrate.

The first thermal conduction layer 110 may be formed on the substrate 100.

The first thermal conduction layer 110 may include a first plate 111, a first protrusion 112*a*, and a second protrusion 112*b*.

The first protrusion 112*a* and the second protrusion 112*b* may be formed on the first plate 111. The first protrusion 112*a* and the second protrusion 112*b* may be protruded from the first plate 111. The first protrusion 112*a* and the second protrusion 112*b* may be disposed, being spaced apart from each other.

The first thermal conduction layer 110 may facilitate dissipation of the heat generated from the first semiconductor pattern 140, the first wire pattern 120 and the second semiconductor pattern 145, to the substrate 100.

The first thermal conduction layer 110 may include a material with a high thermal conductivity. Further, the first thermal conduction layer 110 may adjust the thermal conductivity of the first thermal conduction layer 110 by adjusting a concentration of impurity contained in the first thermal conduction layer 110. This will be described below.

The first thermal conduction layer 110 may include one of silicon (Si), silicon carbide (SiC), aluminum nitride (AlN) and beryllium oxide (BeO), for example.

For convenience of explanation, it is assumed in the following description that the first thermal conduction layer 110 includes silicon.

The field insulating film 105 may be formed on the first thermal conduction layer 110. The field insulating film 105 may at least partially cover the sidewalls of the first protrusion 112*a* and the second protrusion 112*b*.

The field insulating film 105 may include, for example, one of oxide layer, nitride layer, oxynitride layer, or a combination thereof.

The first wire pattern 120 may be formed on the first thermal conduction layer 110. More specifically, the first wire pattern 120 may be formed on the field insulating film 105.

The first wire pattern 120 may be formed, being spaced apart from the field insulating film 105 and extending in a first direction X1. The first wire pattern 120 may be disposed parallel to the upper surface of the substrate 100. That is, the first wire pattern 120 may be laid on X1-Y1 plane.

The first wire pattern 120 may include a first end 120*a* and a second end 120*b* corresponding to each other. The first end 120*a* of the first wire pattern and the second end 120*b* of the first wire pattern may be positioned along the first direction X1.

The first wire pattern 120 may be positioned between the first protrusion 112*a* and the second protrusion 112*b*. As illustrated in FIG. 2, the first wire pattern 120 may not extend above the first protrusion 112*a* and the second protrusion 112*b*, although example embodiments are not limited thereto.

The first wire pattern 120 may be used as a channel region for the transistor. As illustrated, the first wire pattern 120 may have a square cross section, although example embodiments are not limited thereto.

The first wire pattern 120 may include an element semiconductor material such as silicon or germanium, for example. Further, the first wire pattern 120 may include a compound semiconductor such as IV-IV group compound semiconductor or III-V group compound semiconductor.

Specifically, take the IV-IV group compound semiconductor for instance, the first wire pattern 120 may be a binary compound or a ternary compound including, for example, at least two or more of carbon (C), silicon (Si), germanium (Ge) and tin (Sn), or the binary or ternary compound doped with IV group element.

Take the III-V group compound semiconductor for instance; the first wire pattern 120 may be one of a binary compound, a ternary compound or a quaternary compound, which is formed by a combination of a III group element. The III group element may be at least one of aluminum (Al), gallium (Ga), or indium (In), with a V group element which may be one of phosphorus (P), arsenic (As) or antimony (Sb).

Referring to FIG. 1, the semiconductor device according to the first example embodiment may be a transistor employing one first wire pattern 120. However, as an alternative to the example illustrated, two or more wire patterns may be employed as a channel region, in which case one or more wire patterns may be additionally disposed on the first wire pattern 120 at a spacing apart from the first wire pattern.

The first semiconductor pattern 140 may be formed on the first thermal conduction layer 110. The first semiconductor pattern 140 may be in contact with the first end 120*a* of the first wire pattern and the first thermal conduction layer 110.

More specifically, the first semiconductor pattern 140 may be formed on the first protrusion 112*a*. The first semiconductor pattern 140 may be in contact with the first protrusion 112*a*. The first protrusion 112*a* may be positioned between the first semiconductor pattern 140 and the first plate 111.

The second semiconductor pattern 145 may be formed on the first thermal conduction layer 110. The second semiconductor pattern 145 may be formed, being spaced apart from the first semiconductor pattern 140. The second semiconductor pattern 145 may be in contact with the second end 120*b* of the first wire pattern and the first thermal conduction layer 110.

More specifically, the second semiconductor pattern 145 may be formed on the second protrusion 112*b*. The second semiconductor pattern 145 may be in contact with the second protrusion 112*b*. The second protrusion 112*b* may be positioned between the second semiconductor pattern 145 and the first plate 111.

The first wire pattern 120 may be formed between the first semiconductor pattern 140 and the second semiconductor pattern 145. The first wire pattern 120 may be formed, extending longitudinally in the first direction X1 from the first semiconductor pattern 140 toward the second semiconductor pattern 145. In other words, the first wire pattern 120 may be formed, extending longitudinally in the first direction X1, from the second semiconductor pattern 145 toward the first semiconductor pattern 140.

The first semiconductor pattern 140 and the second semiconductor pattern 145 may be included in a source region and a drain region of the semiconductor device 1 according to the first example embodiment. That is, when the first semiconductor pattern 140 is included in the drain region, the second semiconductor pattern 145 may be included in the source region, or vice versa.

An outer circumference of the first semiconductor pattern 140 may have a variety of shapes. For example, the shape of the outer circumference of the first semiconductor pattern 140 may be at least one of diamond, circle and rectangle. FIG. 4 illustrates a rectangular shape as an example.

The first semiconductor pattern 140 and the second semiconductor pattern 145 may include, for example, an epitaxial layer. When the first wire pattern 120 is a silicon wire pattern, the first semiconductor pattern 140 and the second semiconductor pattern 145 may include at least one of silicon (Si), silicon carbide (SiC) or silicon germanium (SiGe), although example embodiments are not limited thereto.

A first gate electrode 130 may be formed, extending in a second direction Y1 and intersecting the first wire pattern 120. The first gate electrode 130 may surround the periphery of the first wire pattern 120, between the first semiconductor pattern 140 and the second semiconductor pattern 145.

The first gate electrode 130 may be formed on the first thermal conduction layer 110 and the field insulating film 105.

The first gate electrode 130 may include at least one of, for example, polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al) or tungsten (W).

A first gate insulating film 125 may be formed between the first wire pattern 120 and the first gate electrode 130. The first gate insulating film 125 may be formed along the periphery of the first wire pattern 120.

Further, the first gate insulating film 125 may be formed between the upper surface of the field insulating film 105 and the first gate electrode 130. As illustrated in FIG. 2, the first gate insulating film 125 may not be formed at an overlapping area of the first wire pattern 120 and the first spacer 135, although example embodiments are not limited thereto.

The first gate insulating film 125 may include, for example, silicon oxide, silicon oxynitride, silicon nitride and a high-k dielectric material with a higher dielectric constant than silicon oxide. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

The first spacer 135 may be formed on a sidewall of the first gate electrode 130 extending in the second direction Y1. For example, the first spacer 135 may include at least one of silicon nitride (SiN), silicon oxynitride (SiON), silicon oxide (SiO2), silicon oxycarbonitride (SiOCN), silicon carbonitride (SiCN), or a combination thereof.

In the semiconductor device 1 according to the first example embodiment, the first gate insulating film 125 may not include a portion extending along a sidewall of the first spacer 135.

An interlayer insulating film 180 may be formed on the field insulating film 105. The interlayer insulating film 180 may cover the first semiconductor pattern 140 and the second semiconductor pattern 145.

The interlayer insulating film 180 may include at least one of silicon oxide, silicon nitride, silicon oxynitride, or a low-k dielectric material, for example. For example, the low-k dielectric material may include flowable oxide (FOX), Tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Further, although not illustrated in FIGS. 2 and 4, the semiconductor device according to the example embodiments may additionally include a metal silicide layer formed on the first semiconductor pattern 140 and the second semiconductor pattern 145.

Referring to FIGS. 2 and 5, the concentration of impurity contained in the first wire pattern 120 may be higher than the concentration of impurity contained in the first thermal conduction layer 110 and the concentration of impurity contained in the substrate 100.

Further, the concentration of impurity contained in the first thermal conduction layer 110 may be different from the concentration of impurity contained in the substrate 100.

A variety of impurities may be included in the substrate 100. However, in describing the semiconductor device according to example embodiments, it is assumed herein that the "impurity concentration" refers to the concentration of the n-type impurity and/or p-type impurity contained in each layer.

In a semiconductor device 1 according to the first example embodiment, the concentration of impurity contained in the first thermal conduction layer 110 may be constant in a thickness direction of the first thermal conduction layer 110, i.e., in a thickness direction of the substrate 100.

Further, in a semiconductor device 1 according to the first example embodiment, the concentration of impurity contained in the first thermal conduction layer 110 may be higher than the concentration of impurity contained in the substrate 100. That is, as illustrated in FIG. 5, the concentration of impurity contained in the respective layers may increase in the direction along the substrate 100, the first thermal conduction layer 110 and the first wire pattern 120.

As illustrated in FIG. 5, the concentration of impurity may discontinuously increase between the substrate 100 and the first thermal conduction layer 110 and between the first thermal conduction layer 110 and the first wire pattern 120, but example embodiments are not limited thereto, as these are provided only for convenience of explanation.

That is, there may be inclination or fluctuation of the impurity concentration between the substrate 100 and the first thermal conduction layer 110, due to impurity diffusion between the substrate 100 and the first thermal conduction layer 110.

For example, the first wire pattern 120 and the first thermal conduction layer 110 may have a same conductivity type. When the semiconductor device according to example embodiments of the present disclosure is a PMOS, the first thermal conduction layer 110 and the first wire pattern 120 used as the channel region may be n-type semiconductor layers. On the contrary, when the semiconductor device according to example embodiments of the present disclosure is an NMOS, the first thermal conduction layer 110 and the first wire pattern 120 used as the channel region may be p-type semiconductor layers.

For another example, the first upper pattern 115 and the first thermal conduction layer 110 may have different conductivity types. When the semiconductor device according to example embodiments of the present disclosure is a PMOS, the first wire pattern 120 used as the channel region may be an n-type semiconductor layer, and the first thermal conduction layer 110 may be a p-type semiconductor layer. On the contrary, when the semiconductor device according to example embodiments of the present disclosure is an NMOS, the first wire pattern 120 used as the channel region may be a p-type semiconductor layer, and the first thermal conduction layer 110 may be an n-type semiconductor layer.

Additionally, in an n-type semiconductor layer, the n-type semiconductor layer may contain n-type impurity only, or alternatively, may contain both n-type and p-type impurities. That is, a semiconductor layer may be the n-type semiconductor layer when the semiconductor layer has a higher concentration of the n-type impurity than that of the p-type impurity.

Accordingly, when both the first wire pattern 120 and the first thermal conduction layer 110 are p-type semiconductor layers, the first wire pattern 120 and the first thermal conduction layer 110 may each contain the p-type impurity only, or may contain both the p-type and n-type impurities. On the contrary, when both the first wire pattern 120 and the first thermal conduction layer 110 are n-type semiconductor layers, the first wire pattern 120 and the first thermal conduction layer 110 may each contain the n-type impurity only, or may contain both the n-type and p-type impurities.

First, the thermal conductivity of the semiconductor layer according to the impurity concentration may be as described below.

The heat generated from the semiconductor layer may be subjected to influence of the phonon, which is the lattice vibration of the matters constructing the semiconductor layer. That is, the thermal conductivity of the semiconductor layer may be altered, when there is a factor that influences the lattice vibration of the matters of the semiconductor layer.

If an impurity is doped or injected into the semiconductor layer to impart a specific conductivity type to the semiconductor layer, the thermal conductivity of the semiconductor layer may be altered according to the impurity concentration.

For example, an impurity contained in the semiconductor layer may act as a factor that hinders the lattice vibration of the semiconductor materials. That is, the phonon scattering may be generated due to the impurity contained in the semiconductor layer.

Accordingly, the phonon scattering becomes greater, as the concentration of impurity contained in the semiconductor layer increases. As such, the thermal conductivity of the semiconductor layer may decrease, as the concentration of impurity contained in the semiconductor layer increases.

The heat-escaping channel for the removal of the heat generated at the wire pattern-shaped channel region is narrower than the heat-escaping channel for the removal of the heat generated at the channel region of the planar transistor. Accordingly, in a semiconductor device including a wire pattern-shaped channel region, the heat-escaping path for the removal of the heat generated at the channel region may be limited to the width of the source region and the drain region contacting the wire pattern. Accordingly, the semiconductor device including a wire pattern-shaped channel region may be weak against the heat generated at the channel region (i.e., to self-heating).

However, as in the semiconductor device according to example embodiments of the present disclosure, the first thermal conduction layer 110 with higher thermal conductivity may be interposed between the substrate 100 and the first wire pattern 120 used as the channel region, thus allowing effective diffusion of the heat generated at the first wire pattern 120 to the substrate 100 via the first thermal conduction layer 110.

In other words, in a semiconductor device according to example embodiments of the present disclosure, the heat generated at the first wire pattern 120 can be efficiently diffused to the substrate 100, by disposing the first thermal conduction layer 110 with a lower impurity concentration than the first wire pattern 120 under the first semiconductor pattern 140 and the second semiconductor pattern 145 contacting the first wire pattern 120. Accordingly, the semiconductor device can enhance operating performance and reliability.

Figure 6:
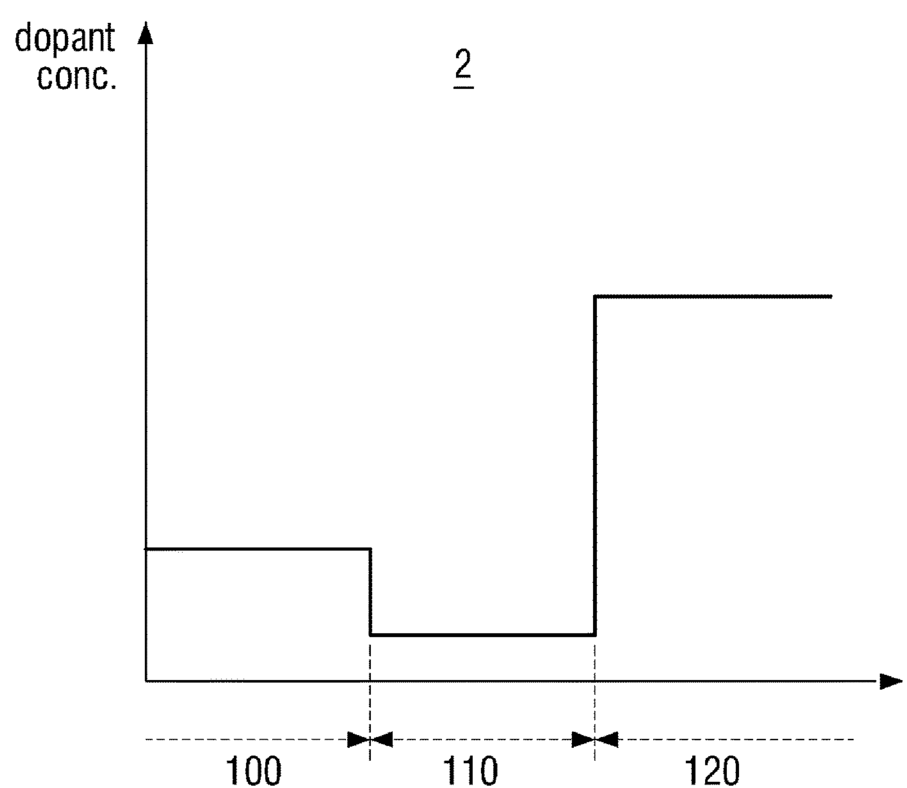
FIG. 6 is a schematic view illustrating an impurity concentration of a substrate and a thermal conduction layer included in a semiconductor device according to a second example embodiment.
Figure 7:
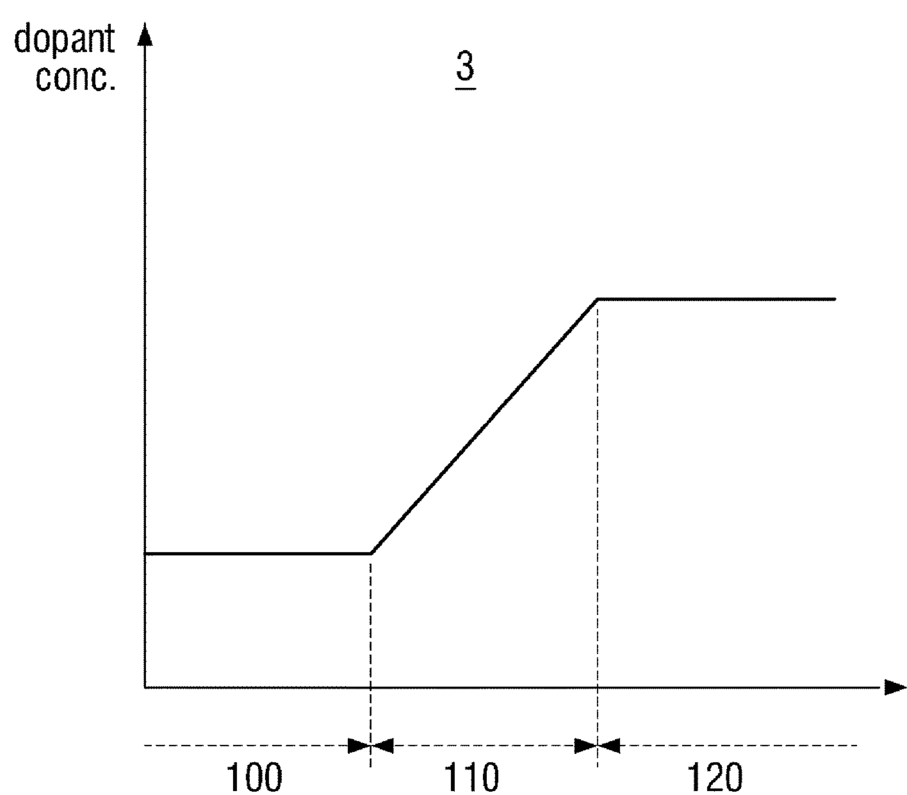
FIG. 7 is a schematic view illustrating an impurity concentration of a substrate and a thermal conduction layer included in a semiconductor device according to a third example embodiment.
Figure 8:
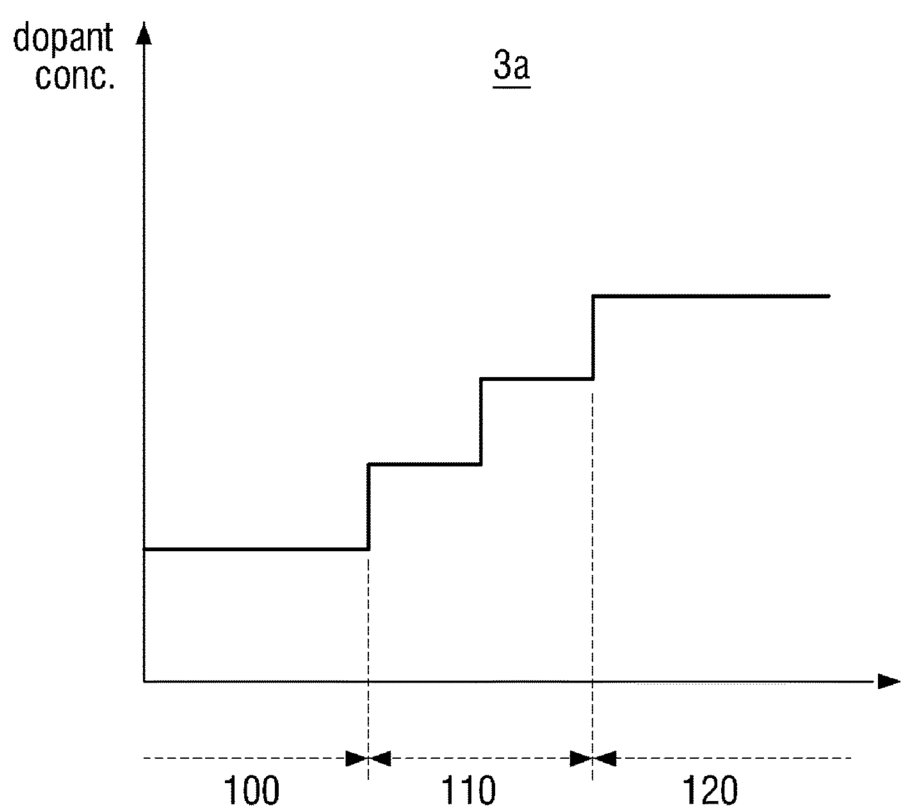
FIG. 8 is a schematic view illustrating an impurity concentration of a substrate and a thermal conduction layer included in a semiconductor device according to a modified example of a third example embodiment.
Figure 9:
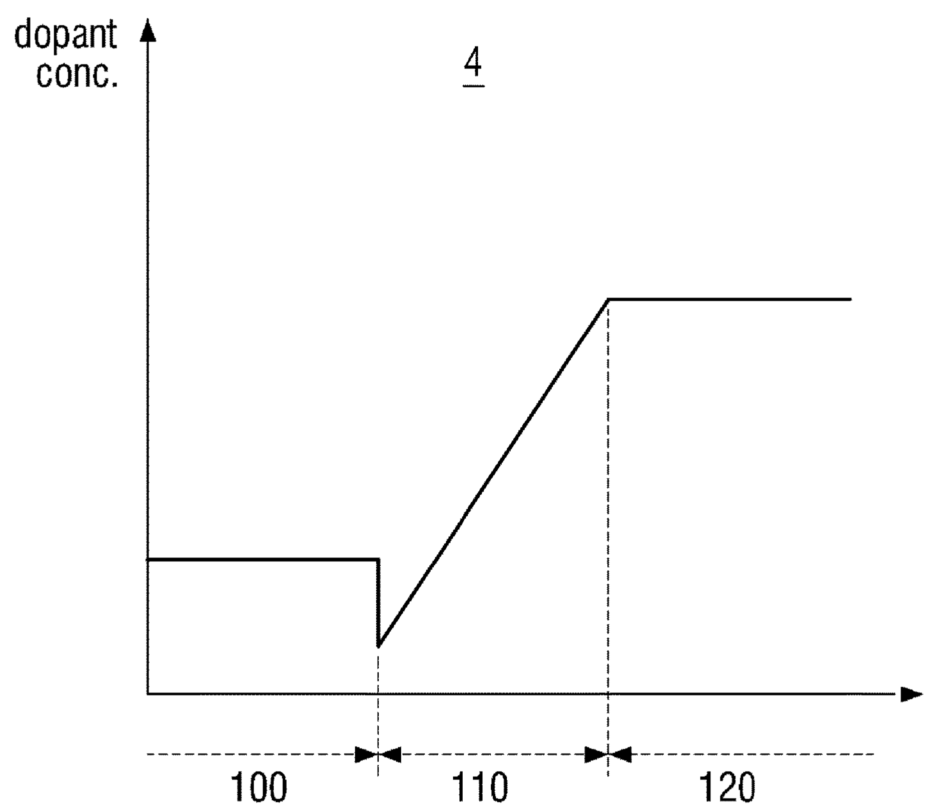
FIG. 9 is a schematic view illustrating an impurity concentration of a substrate and a thermal conduction layer included in a semiconductor device according to a fourth example embodiment.
Figure 10:
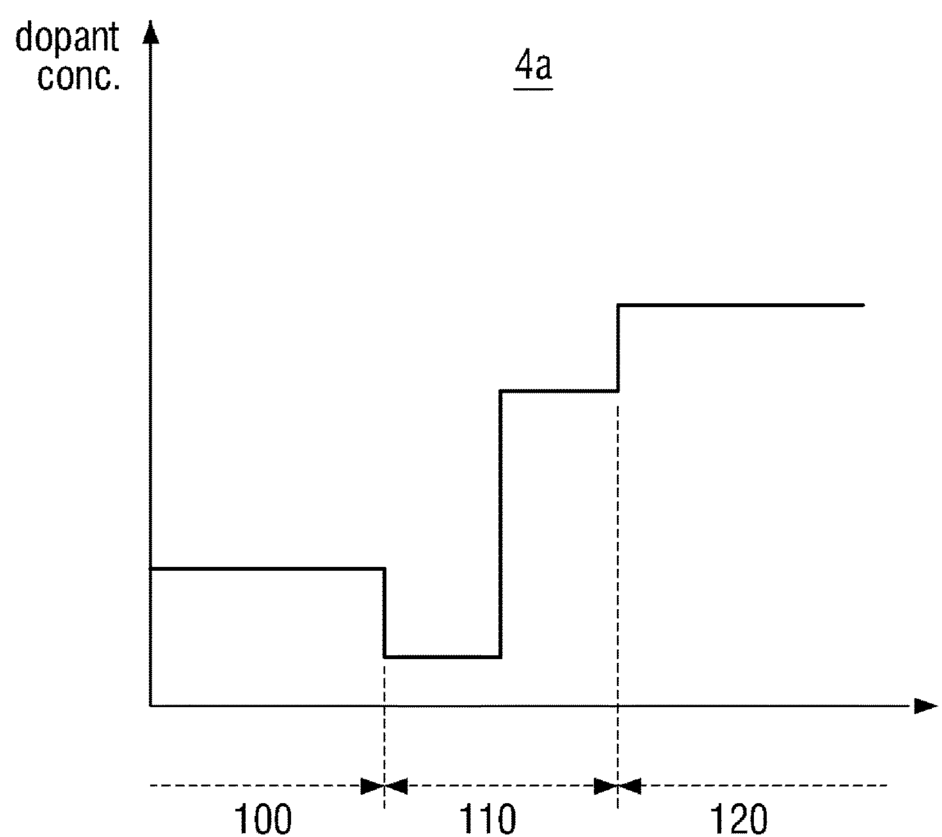
FIG. 10 is a schematic view illustrating an impurity concentration of a substrate and a thermal conduction layer included in a semiconductor device according to a modified example of a fourth example embodiment.

FIG. 6 is a schematic view illustrating an impurity concentration of a substrate and a thermal conduction layer included in a semiconductor device according to a second example embodiment. FIG. 7 is a schematic view illustrating an impurity concentration of a substrate and a thermal conduction layer included in a semiconductor device according to a third example embodiment. FIG. 8 is a schematic view illustrating an impurity concentration of a substrate and a thermal conduction layer included in a semiconductor device according to a modified example of a third example embodiment. FIG. 9 is a schematic view illustrating an impurity concentration of a substrate and a thermal conduction layer included in a semiconductor device according to a fourth example embodiment. FIG. 10 is a schematic view illustrating an impurity concentration of a substrate and a thermal conduction layer included in a semiconductor device according to a modified example of a fourth example embodiment. For convenience of explanation, differences from the example embodiments explained above with reference to FIGS. 1 to 5 will be mainly explained below.

For reference, FIGS. 6 to 10 schematically illustrate the impurity concentration of the wire pattern of FIG. 2 and the impurity concentration of the thermal conduction layer along Line 1.

Referring to FIG. 6, in a semiconductor device 2 according to the second example embodiment, the concentration of impurity contained in the first thermal conduction layer 110 may be constant in a thickness direction of the first thermal conduction layer 110, i.e., in a thickness direction of the substrate 100. The concentration of impurity contained in the first thermal conduction layer 110 may be lower than the concentration of impurity contained in the substrate 100.

Further, the concentration of impurity contained in the first wire pattern 120 may be higher than the concentration of impurity contained in the first thermal conduction layer 110.

Accordingly, the concentration of impurity contained in the first wire pattern 110 may be lower than the concentration of impurity contained in the first wire pattern 120 and the concentration of impurity contained in the substrate 100.

Additionally, the first thermal conduction layer 110 may be an un-doped semiconductor material pattern, but not limited thereto.

The term "un-doped" as used herein refers to the state that the first thermal conduction layer 110 does not contain an impurity that is intentionally doped or injected by a manufacturer of the semiconductor device, rather than to the state that the first thermal conduction layer 110 contains no impurity.

Accordingly, it is possible that the first thermal conduction layer 110 may contain the impurity which may be moved from the substrate 100 or from the first and second semiconductor patterns 140, 145 by diffusion, or the like.

Referring to FIG. 7, in a semiconductor device 3 according to the third example embodiment, the concentration of impurity contained in the first thermal conduction layer 110 may be varied in a thickness direction of the first thermal conduction layer 110, i.e., in a thickness direction of the substrate 100.

For example, the concentration of impurity contained in the first thermal conduction layer 110 may increase in a direction farther away from the substrate 100. The concentration of impurity contained in the first thermal conduction layer 110 may continuously increase in a direction from the lowermost portion of the first thermal conduction layer 110 to the uppermost portion of the first thermal conduction layer 110.

As illustrated in FIG. 7, the concentration profile of the impurity contained in the first thermal conduction layer 110 may vary in a linear fashion, but example embodiments are not limited thereto, as these are provided only for convenience of explanation.

The concentration of impurity contained in the first thermal conduction layer 110 may vary along the thickness direction of the substrate 100, but the concentration of impurity contained in the first thermal conduction layer 110 may be equal to or lower than the concentration of impurity contained in the first wire pattern 120, or equal to or higher than the concentration of impurity contained in the substrate 100.

Accordingly, in the semiconductor device 3 according to the third example embodiment, the concentration of impurity contained in the first thermal conduction layer 110 may not be lower than the concentration of impurity contained in the substrate 100, and may not be higher than the concentration of impurity contained in the first wire pattern 120.

The concentration of impurity near the center of the first thermal conduction layer 110 may be higher than the concentration of impurity contained in the substrate 100, and lower than the concentration of impurity contained in the first wire pattern 120.

As illustrated in FIG. 7, the concentration of impurity may be continuous between the substrate 100 and the first thermal conduction layer 110, and between the first thermal conduction layer 110 and the first wire pattern 120, but example embodiments are not limited thereto, as these are provided only for convenience of explanation.

Accordingly, the concentration of impurity at the lowermost portion of the first thermal conduction layer 110 may be higher than the concentration of impurity contained in the substrate 100, or the concentration of impurity at the uppermost portion of the first thermal conduction layer 110 may be lower than the concentration of impurity contained in the first wire pattern 120.

Since the concentration of impurity contained in the first thermal conduction layer 110 increases in a direction farther away from the substrate 100, the punch-through effect in the semiconductor device can be reduced, and the heat generated at the channel region of the semiconductor device can be efficiently diffused to the substrate 100.

Referring to FIG. 8, in a semiconductor device 3*a* according to a modified example of the third example embodiment, the concentration of impurity contained in the first thermal conduction layer 110 may increase in a step-wise fashion in a direction farther away from the substrate 100.

In other words, the first thermal conduction layer 110 may include a plurality of thermal conduction layers having different impurity concentrations. Accordingly, the upper thermal conduction layer, which is closer to the first semiconductor pattern 140, may have a higher impurity concentration than the lower thermal conduction layer which is much farther from the first upper pattern 115.

Referring to FIG. 9, in a semiconductor device 4 according to the fourth example embodiment, the concentration of impurity contained in the first thermal conduction layer 110 may be varied in a thickness direction of the first thermal conduction layer 110, i.e., in a thickness direction of the substrate 100, and the first thermal conduction layer 110 may include a portion with a lower impurity concentration than the substrate 100.

For example, the first thermal conduction layer 110 may include an un-doped semiconductor region at a portion adjacent to the substrate 100, although example embodiments are not limited thereto.

The concentration of impurity contained in the first thermal conduction layer 110 may increase in a direction farther away from the substrate 100. The concentration of impurity contained in the first thermal conduction layer 110 may continuously increase in a direction from the lowermost portion of the first thermal conduction layer 110 to the uppermost portion of the first thermal conduction layer 110.

The concentration of impurity contained in the first thermal conduction layer 110 may be lower than the concentration of impurity contained in the substrate 100, at the lowermost portion of the first thermal conduction layer 110. Further, the concentration of impurity contained in the first thermal conduction layer 110 may vary along the thickness direction of the substrate 100, but the concentration of impurity contained in the first thermal conduction layer 110 may be equal to or lower than the concentration of impurity contained in the first wire pattern 120.

As illustrated in FIG. 9, the concentration of impurity near the center of the first thermal conduction layer 110 may be higher than the concentration of impurity contained in the substrate 100, but example embodiments are not limited thereto.

Additionally, as illustrated in FIG. 9, the concentration profile of the impurity contained in the first thermal conduction layer 110 may vary in a linear fashion and the concentration of impurity may be discontinuous between the substrate 100 and the first thermal conduction layer 110, but example embodiments are not limited thereto, as these are provided only for convenience of explanation.

Referring to FIG. 10, in a semiconductor device 4*a* according to a modified example of the fourth example embodiment, the concentration of impurity contained in the first thermal conduction layer 110 may increase in a stepwise fashion in a direction farther away from the substrate 100.

The first thermal conduction layer 110 may include a plurality of thermal conduction layers having different impurity concentrations. For example, in the first thermal conduction layer 110, the thermal conduction layer with lower impurity concentration than the substrate 100 may be disposed in a region closest to the substrate 100, and the thermal conduction layer with higher impurity concentration than the substrate 100 may be disposed in a region close to the first semiconductor pattern 140.

The thermal conduction layer of the first thermal conduction layer 110, which has a lower impurity concentration than the substrate 100, may include an un-doped semiconductor epitaxial layer, although example embodiments are not limited thereto.

Figure 11:
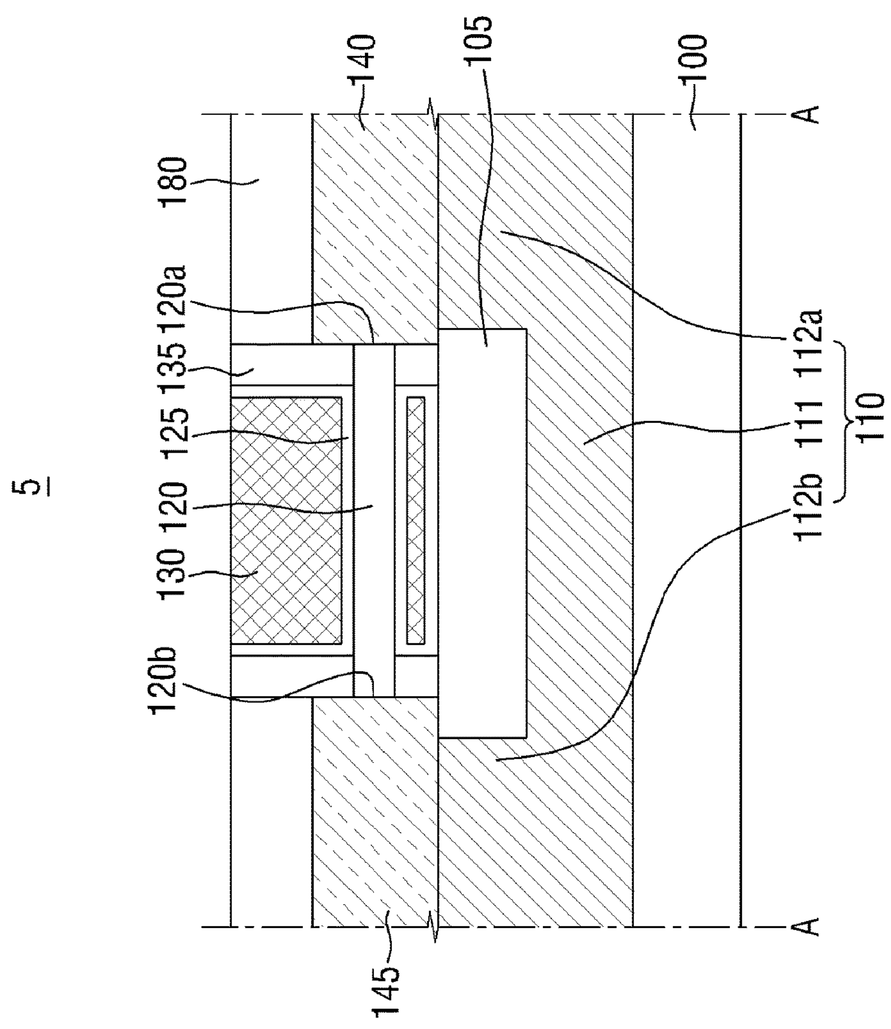
FIG. 11 is a view provided to explain a semiconductor device according to a fifth example embodiment.

FIG. 11 is a view provided to explain a semiconductor device according to a fifth example embodiment. For convenience of explanation, differences from the example embodiments explained above with reference to FIGS. 1 to 5 will be mainly explained below.

Referring to FIG. 11, in a semiconductor device 5 according to the fifth example embodiment, the first gate insulating film 125 may include a portion extending along a sidewall of the first spacer 135.

The portion of the first gate insulating film 125 being formed along a periphery of the first wire pattern 120, and the portion of the first gate insulating film 125 extending along the sidewall of the first spacer 135 may be connected with each other.

For example, the first gate electrode 130 may be formed by a replacement process (or gate last process).

Figure 12:
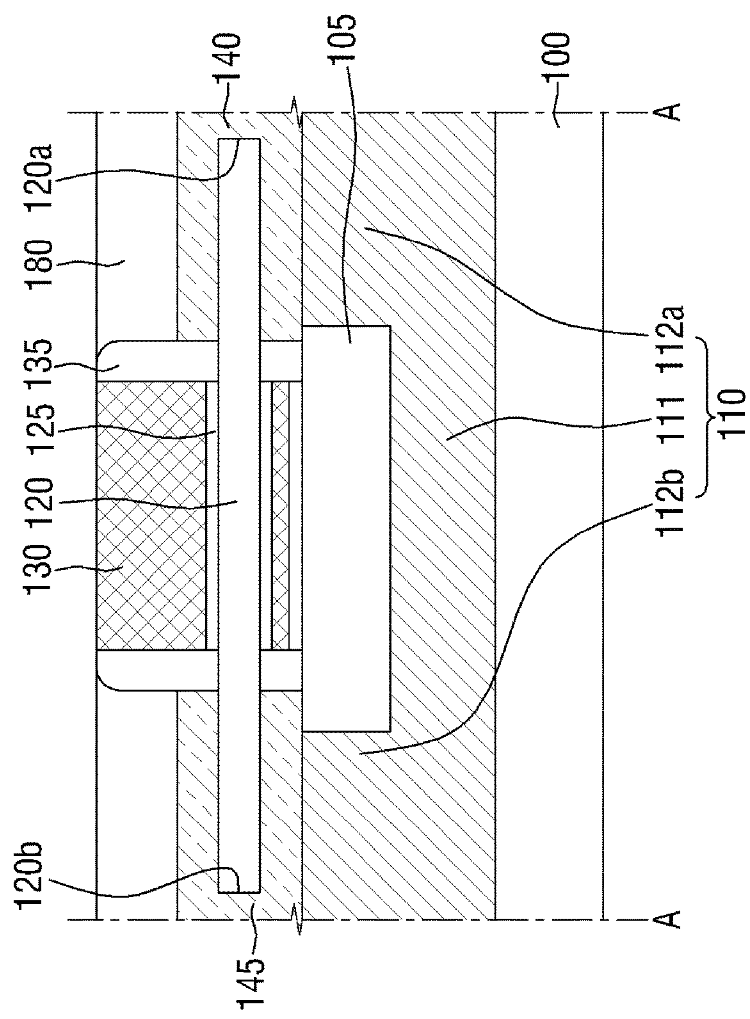
FIGS. 12 and 13 are views provided to explain a semiconductor device according to a sixth example embodiment.
Figure 13:
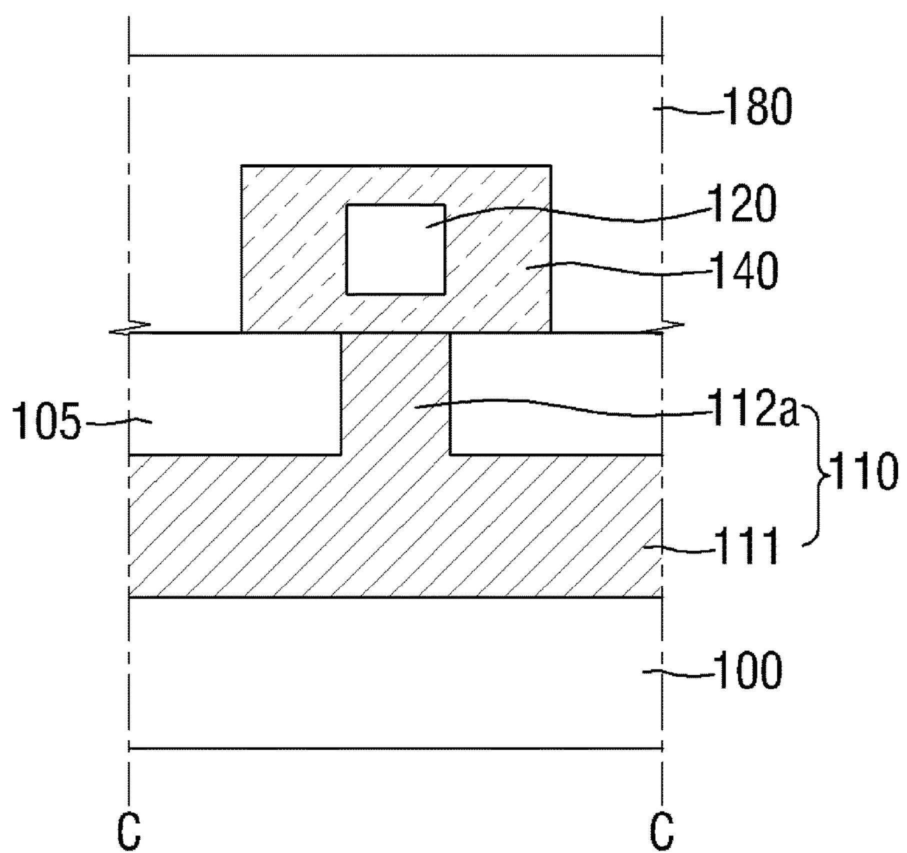

FIGS. 12 and 13 are views provided to explain a semiconductor device according to a sixth example embodiment. For convenience of explanation, differences from the example embodiments explained above with reference to FIGS. 1 to 5 will be mainly explained below.

For reference, FIG. 12 is a cross sectional view taken on line A-A of FIG. 1, and FIG. 13 is a cross sectional view taken on line C-C of FIG. 1.

Referring to FIGS. 12 and 13, in a semiconductor device 6 according to the sixth example embodiment, the first semiconductor pattern 140 and the second semiconductor pattern 145 may be formed along the profile of the first wire pattern 120.

The first semiconductor pattern 140 and the second semiconductor pattern 145 may be so formed as to surround the portion of the first wire pattern 120 protruding from the outer sidewall of the first spacer 135.

A portion of the first wire pattern 120 may extend above the first protrusion 112*a* and the second protrusion 112*b*. The first semiconductor pattern 140 may surround the portion of the first wire pattern 120 extending above the first protrusion 112*a*, and the second semiconductor pattern 145 may surround the portion of the first wire pattern extending above the second protrusion 112*b*.

Figure 14:
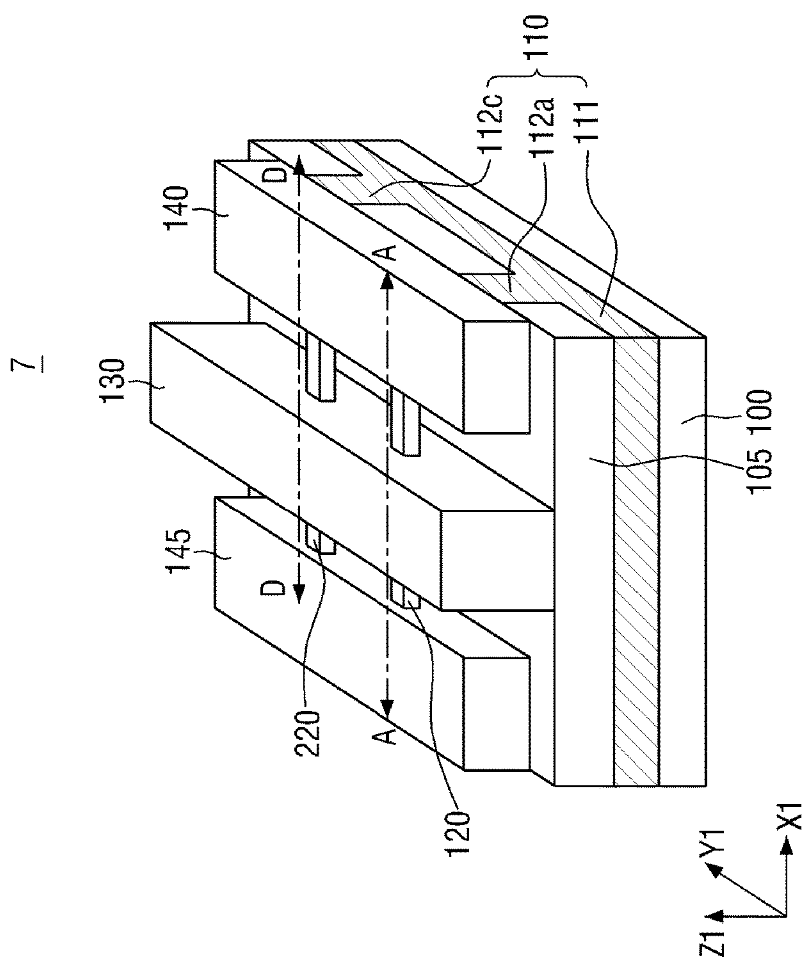
FIG. 14 is a perspective view provided to explain a semiconductor device according to a seventh example embodiment.
Figure 15:
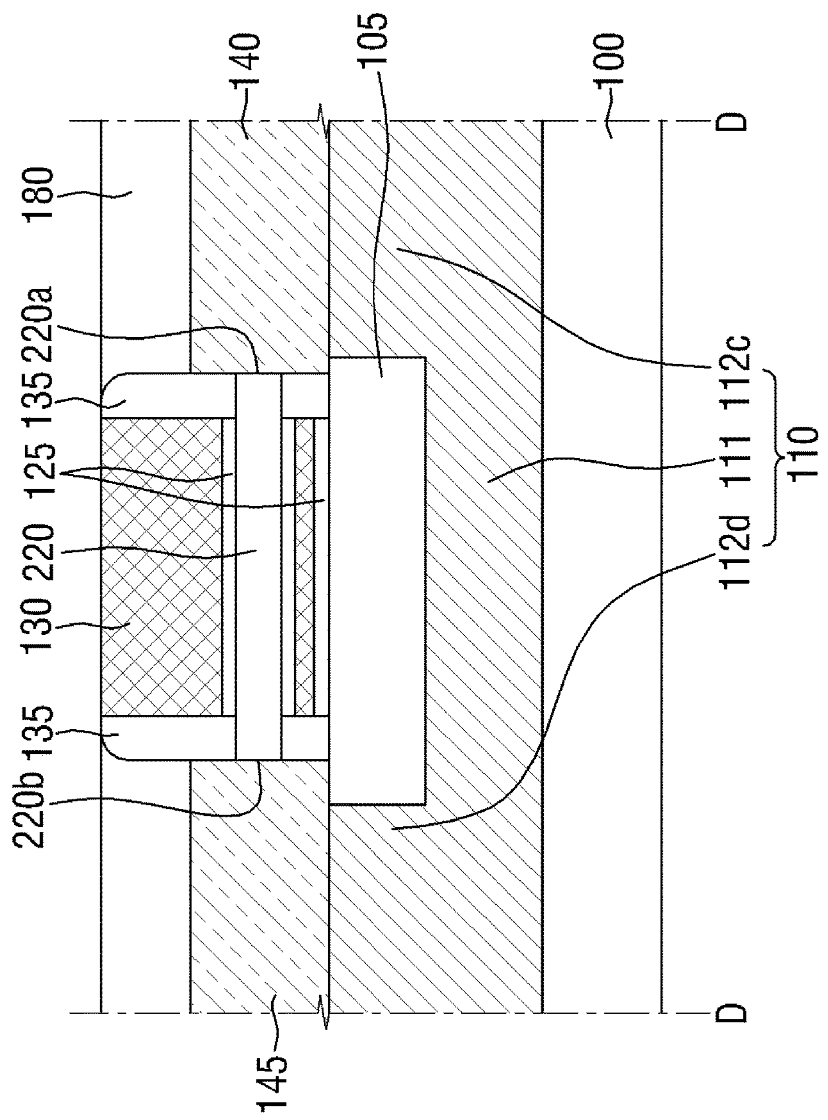
FIG. 15 is a cross sectional view taken on line D-D of FIG. 14.

FIG. 14 is a perspective view provided to explain a semiconductor device according to a seventh example embodiment. FIG. 15 is a cross sectional view taken on line D-D of FIG. 14. For convenience of explanation, differences from the example embodiments explained above with reference to FIGS. 1 to 5 will be mainly explained below.

For reference, FIG. 14 does not illustrate the interlayer insulating film 180 for convenience of explanation, and a cross sectional view taken on line A-A of FIG. 14 may be identical to FIG. 2.

Referring to FIGS. 14 and 15, a semiconductor device 7 according to the seventh example embodiment may additionally include a second wire pattern 220.

The first thermal conduction layer 110 may additionally include a third protrusion 112*c* and a fourth protrusion 112*d*. The third protrusion 112*c* and the fourth protrusion 112*d* may be formed on the first plate 111, respectively. The third protrusion 112*c* and the fourth protrusion 112*d* may be protruded from the first plate 111, respectively.

The third protrusion 112*c* and the fourth protrusion 112*d* may be disposed, being spaced apart from each other. Further, the third protrusion 112*c* and the fourth protrusion 112*d* may be disposed, being spaced apart from the first protrusion 112*a* and the second protrusion 112*b*, respectively.

The field insulating film 105 may at least partially cover the sidewalls of the third protrusion 112*c* and the fourth protrusion 112*d*.

The second wire pattern 220 may be formed on the first thermal conduction layer 110. The second wire pattern 220 may be formed on the field insulating film 105.

The second wire pattern 220 may be formed, being spaced apart from the field insulating film 105 and extending in a first direction X1. The second semiconductor pattern 220 may be formed, being spaced apart from the first wire pattern 120.

The first wire pattern 120 and the second wire pattern 220 may be aligned in a second direction Y1. The first wire pattern 120 and the second wire pattern 220 may be disposed abreast with each other.

The second wire pattern 220 may be disposed parallel to the upper surface of the substrate 100. The second wire pattern 220 may be laid on the X1-Y1 plane, like the first wire pattern 120.

The second wire pattern 220 may include a first end 220*a* and a second end 220*b* corresponding to each other. The first end 220*a* of the second wire pattern and the second end 220*b* of the second wire pattern may be positioned along the first direction X1.

The second wire pattern 220 may be positioned between the third protrusion 112*c* and the fourth protrusion 112*d*. As illustrated in FIG. 15, the second wire pattern 220 may not extend above the third protrusion 112*c* and the fourth protrusion 112*d*, although example embodiments are not limited thereto.

The first semiconductor pattern 140 may be in contact with the first end 120*a* of the first wire pattern, the first end 220*a* of the second wire pattern, and the first thermal conduction layer 110. More specifically, the first semiconductor pattern 140 may be in contact with the first protrusion 112*a* and the third protrusion 112*c*.

The second semiconductor pattern 145 may be in contact with the second end 120*c* of the first wire pattern, the second end 220*b* of the second wire pattern, and the first thermal conduction layer 110. More specifically, the second semiconductor pattern 145 may be in contact with the second protrusion 112*b* and the fourth protrusion 112*d*.

A first gate electrode 130 may be formed so as to intersect the first wire pattern 120 and the second wire pattern 220. The first gate electrode 130 may surround the periphery of the first wire pattern 120 and the periphery of the second wire pattern 220, between the first semiconductor pattern 140 and the second semiconductor pattern 145.

The first gate insulating film 125 may be formed along not only the periphery of the first wire pattern 120, but also the periphery of the second wire pattern 220.

A portion of the first wire pattern 120 and a portion of the second wire pattern 220 may each include a part overlapping with the first spacer 135.

Figure 16:
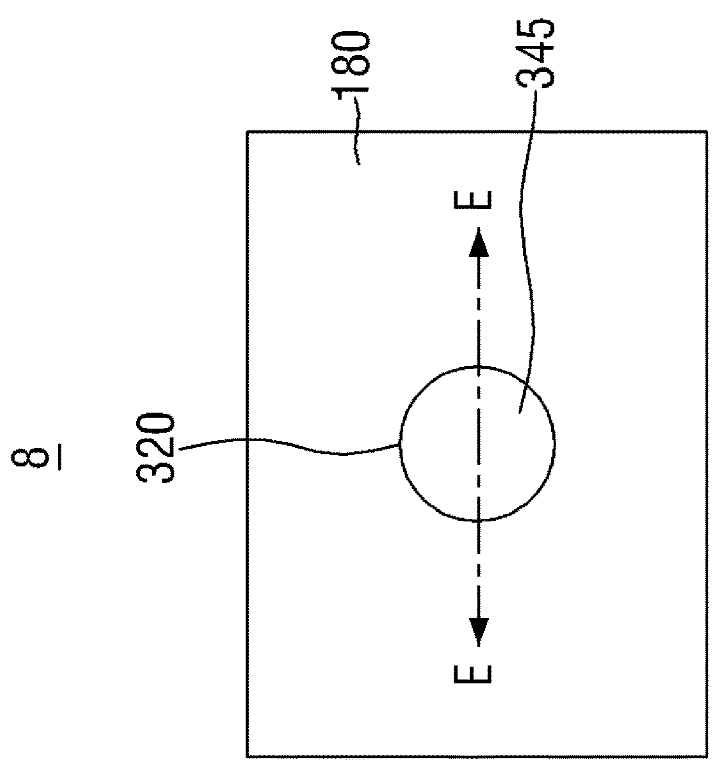
FIG. 16 is a top view provided to explain a semiconductor device according to an eighth example embodiment.
Figure 17:
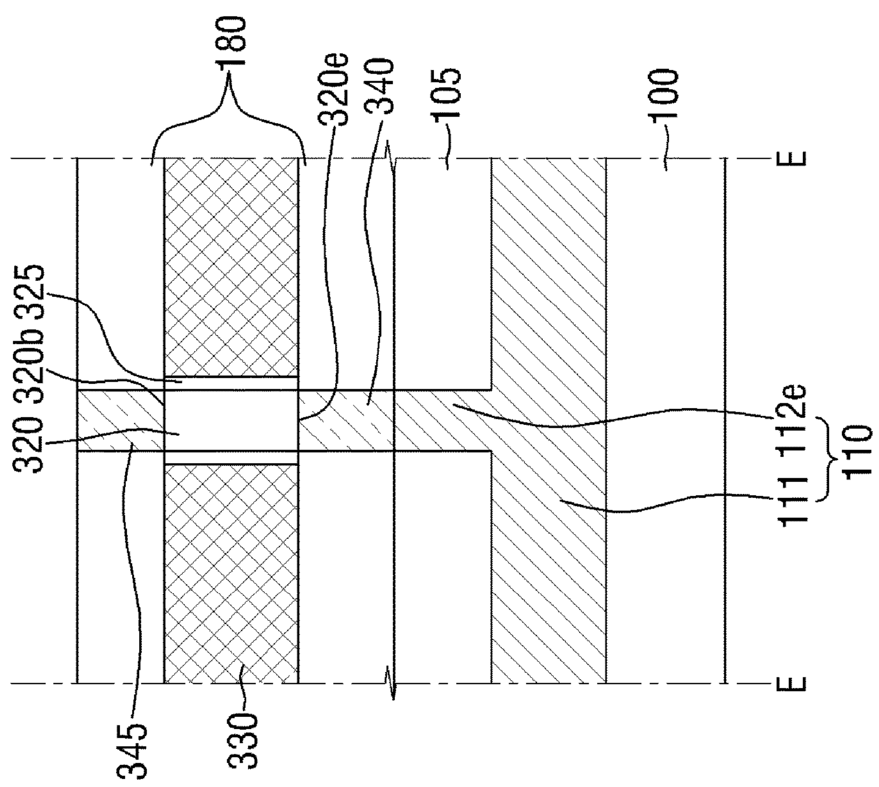
FIG. 17 is a cross sectional view taken on line E-E of FIG. 16.

FIG. 16 is a top view provided to explain a semiconductor device according to an eighth example embodiment. FIG. 17 is a cross sectional view taken on line E-E of FIG. 16. For convenience of explanation, overlapping description with the example embodiments described above with reference to FIGS. 1 to 5 will be omitted.

Referring to FIGS. 16 and 17, a semiconductor device 8 according to the eighth example embodiment may include a first thermal conduction layer 110, a third wire pattern 320, a third semiconductor pattern 340, and a fourth semiconductor pattern 345.

The first thermal conduction layer 110 may include a first plate 111, and a fifth protrusion 112*e* protruding from the first plate 111.

The field insulating film 105 may at least partially cover the sidewall of the fifth protrusion 112*e*.

The third wire pattern 320 may be formed on the first thermal conduction layer 110, and the third wire pattern 320 may be formed on the fifth protrusion 112*e*. The third wire pattern 320 may be disposed so as to overlap with the fifth protrusion 112*e* perpendicularly.

The third wire pattern 320 may extend in a direction perpendicular to the upper surface of the substrate 100. The third wire pattern 320 may be disposed perpendicularly with respect to the upper surface of the substrate 100. That is, the third wire pattern 320 may be formed abreast with the normal line of the upper surface of the substrate 100.

The third wire pattern 320 may include a first end 320*a* and a second end 320*b* corresponding to each other. The first end 320*a* of the third wire pattern and the second end 320*b* of the third wire pattern may face each other in a thickness direction of the substrate 100.

The third semiconductor pattern 340 may be formed on the first thermal conduction layer 110. The third semiconductor pattern 340 may be in contact with the first end 320*a* of the third wire pattern and the first thermal conduction layer 110.

More specifically, the third semiconductor pattern 340 may be formed on the fifth protrusion 112*e*. The third semiconductor pattern 140 may be in contact with the third protrusion 112*e*.

The third semiconductor pattern 340 may be disposed between the first thermal conduction layer 110 and the third wire pattern 320. More specifically, the third semiconductor pattern 340 may be disposed between the fifth protrusion 112*e* and the third wire pattern 320, in the thickness direction of the substrate 100.

The fourth semiconductor pattern 345 may be formed on the first thermal conduction layer 110. The fourth semiconductor pattern 345 may be formed on the third wire pattern 320.

The third semiconductor pattern 340, the third wire pattern 320 and the fourth semiconductor pattern 345 may be stacked in sequence on the fifth protrusion 112*e*.

The fourth semiconductor pattern 345 may contact the second end 320*b* of the third wire pattern. However, the fourth semiconductor pattern 345 may not contact the first thermal conduction layer 110.

The second gate electrode 330 may be formed so as to intersect the third wire pattern 320. The second gate electrode 330 may surround the periphery of the third wire pattern 320, between the third semiconductor pattern 340 and the fourth semiconductor pattern 345.

The second gate electrode 330 may be disposed parallel to the upper surface of the substrate 100.

The second gate insulating film 325 may be formed between the third wire pattern 320 and the second gate electrode 330. The second gate insulating film 325 may be formed along the periphery of the third wire pattern 320.

Figure 18:
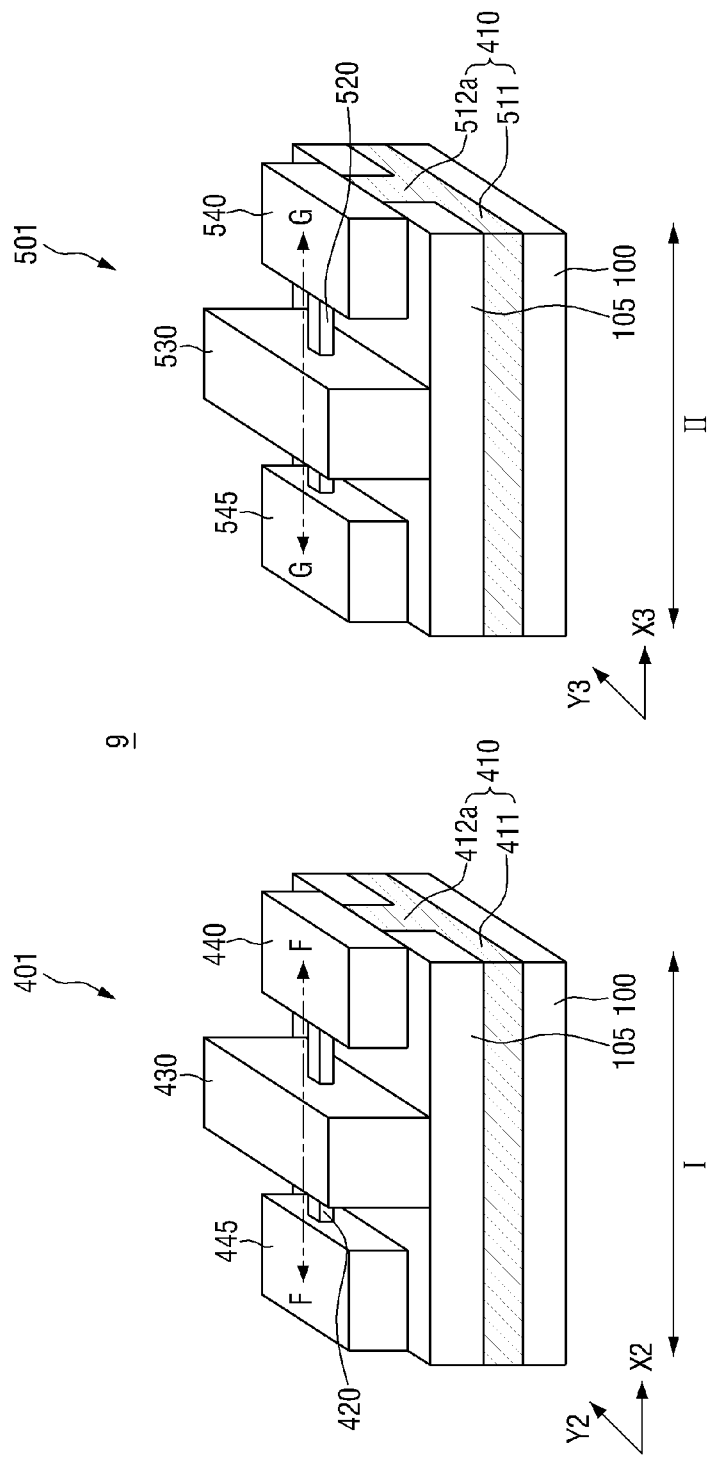
FIG. 18 are perspective views provided to explain a semiconductor device according to a ninth example embodiment.
Figure 19:
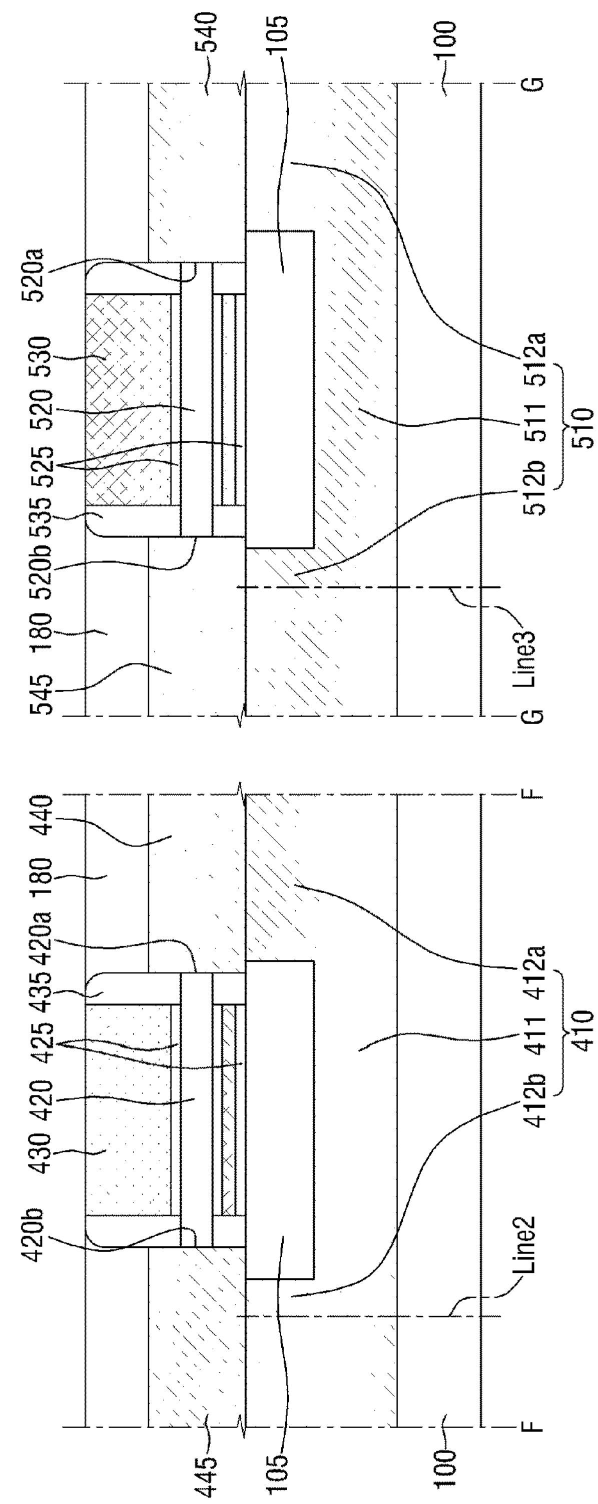
FIG. 19 are cross sectional views taken on lines F-F and G-G of FIG. 19.
Figure 20:
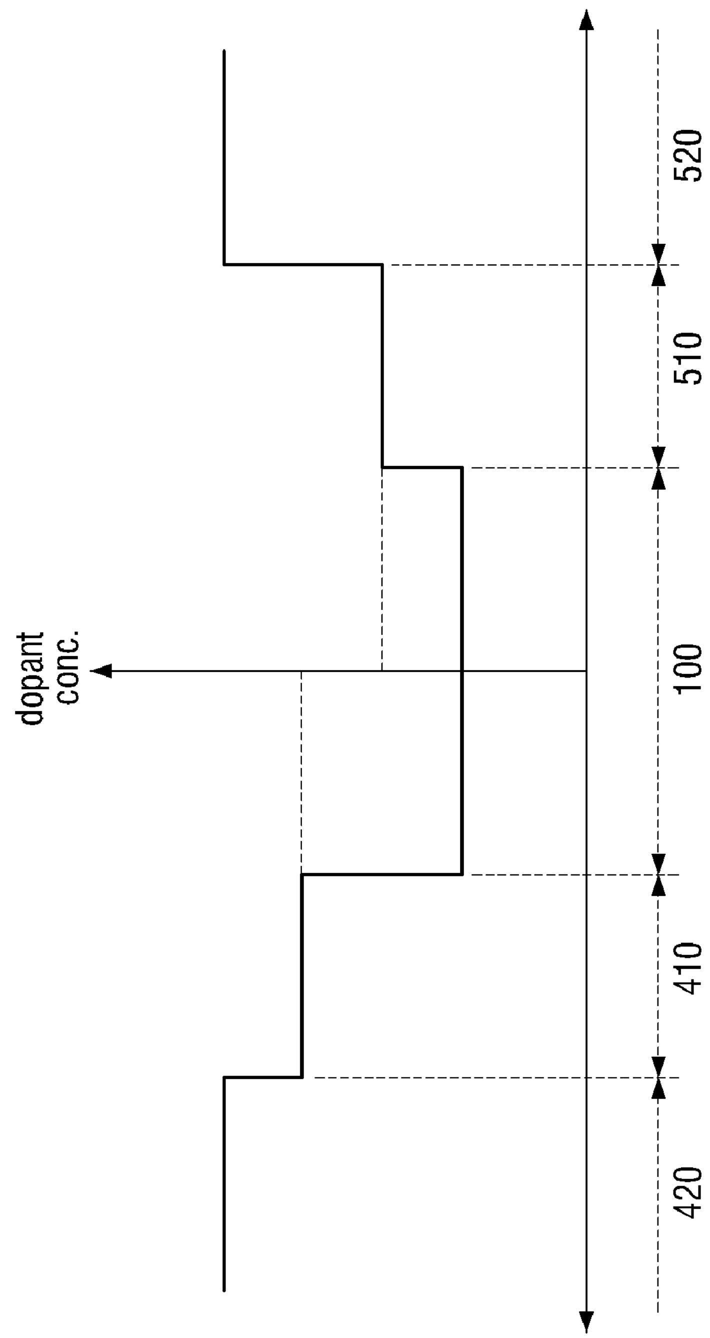
FIG. 20 is a schematic view illustrating an impurity concentration along Line 2 and Line 3 of FIG. 19.

FIG. 18 illustrates perspective views provided to explain a semiconductor device according to a ninth example embodiment. FIG. 19 illustrates cross sectional views taken on lines F-F and G-G of FIG. 19. FIG. 20 is a schematic view illustrating an impurity concentration along Line 2 and Line 3 of FIG. 19.

For reference, the cross sectional views taken on lines F-F and G-G of FIG. 18 are illustrated in a similar manner as the cross sectional views of FIG. 2 for convenience of explanation only. Accordingly, example embodiments are not limited to such illustration. That is, the cross sectional views taken on lines F-F and G-G of FIG. 18 may be similar to any of FIGS. 2, 11 and 12.

Referring to FIGS. 18 and 19, a semiconductor device 9 according to the ninth example embodiment may include a second thermal conduction layer 410, a fourth wire pattern 420, a third gate electrode 430, a third thermal conduction layer 510, a fifth wire pattern 520 and a fourth gate electrode 530.

The substrate 100 may include a first region I and a second region II. The first region I and the second region II may be the regions being spaced apart from each other, or connected with each other.

In a semiconductor device according to the ninth example embodiment, the first region I of the substrate and the second region II of the substrate may be the regions where different conductivity types of transistors are formed.

That is, when the first region I of the substrate is located where the N-type transistor is formed, the second region II of the substrate may be located where the P-type transistor is formed. On the contrary, when the first region I of the substrate is located where the P-type transistor is formed, the second region II of the substrate may be located where the N-type transistor is formed.

Hereinbelow, it is assumed that the first region I and the second region II are located where the transistors of different conductivity types are formed.

A first transistor 401 may be formed in the first region I of the substrate 100. For example, the first transistor 401 may be an N-type transistor. The first transistor 401 may include a second thermal conduction layer 410, a fourth wire pattern 420, and a third gate electrode 430.

The second thermal conduction layer 410 may be formed on the substrate 100. The second thermal conduction layer 410 may include a second plate 411, a sixth protrusion 412*a*, and a seventh protrusion 412*b*.

The sixth protrusion 412*a* and the seventh protrusion 412*b* may be formed on the second plate 411, respectively. The sixth protrusion 412*a* and the seventh protrusion 412*b* may be protruded from the second plate 411, respectively. The sixth protrusion 412*a* and the seventh protrusion 412*b* may be disposed, being spaced apart from each other.

The field insulating film 105 may be formed on the second thermal conduction layer 410. The field insulating film 105 may at least partially cover the sidewalls of the sixth protrusion 412*a* and the seventh protrusion 412*b*.

The fourth wire pattern 420 may be formed on the second thermal conduction layer 410. The fourth wire pattern 420 may be formed on the field insulating film 105.

The fourth wire pattern 420 may be formed, being spaced apart from the field insulating film 105 and extending in a third direction X2.

The fourth wire pattern 420 may be disposed parallel to the upper surface of the substrate 100. The fourth wire pattern 420 may be laid on X2-Y2 plane.

The fourth wire pattern 420 may include a first end 420*a* and a second end 420*b* corresponding to each other. The first end 420*a* of the fourth wire pattern and the second end 420*b* of the fourth wire pattern may be positioned along the third direction X2.

The fourth wire pattern 420 may be positioned between the sixth protrusion 412*a* and the seventh protrusion 412*b*. As illustrated in FIG. 19, the fourth wire pattern 420 may not extend above the sixth protrusion 412*a* and the seventh protrusion 412*b*, although example embodiments are not limited thereto.

The fifth semiconductor pattern 440 may be formed on the second thermal conduction layer 410. The fifth semiconductor pattern 440 may contact the first end 420*a* of the fourth wire pattern and the second thermal conduction layer 410.

More specifically, the fifth semiconductor pattern 440 may be formed on the sixth protrusion 412*a*. The fifth semiconductor pattern 440 may contact the sixth protrusion 412*a*.

The sixth semiconductor pattern 445 may be formed on the second thermal conduction layer 410. The sixth semiconductor pattern 445 may be formed, being spaced apart from the fifth semiconductor pattern 440. The sixth semiconductor pattern 445 may contact the second end 420*b* of the fourth wire pattern and the second thermal conduction layer 410.

More specifically, the sixth semiconductor pattern 445 may be formed on the seventh protrusion 412*b*. The sixth semiconductor pattern 450 may be in contact with the seventh protrusion 412*b*.

The fourth wire pattern 420 may be formed between the fifth semiconductor pattern 440 and the sixth semiconductor pattern 445.

The fifth semiconductor pattern 440 and the sixth semiconductor pattern 445 may be included in a source region and a drain region of the first transistor 401 of the semiconductor device 9 according to the ninth example embodiment.

The third gate electrode 430 may be formed, extending in a fourth direction Y2 and intersecting the fourth wire pattern 420. The third gate electrode 430 may surround the periphery of the fourth wire pattern 420, between the fifth semiconductor pattern 440 and the sixth semiconductor pattern 445.

A second transistor 501 may be formed in the second region II of the substrate 100. For example, the second transistor 501 may be a P-type transistor. The second transistor 501 may include a third thermal conduction layer 510, a fifth wire pattern 520, and a fourth gate electrode 530.

The third thermal conduction layer 510 may be formed on the substrate 100. The third thermal conduction layer 510 may include a third plate 511, an eighth protrusion 512*a*, and a ninth protrusion 512*b*.

The eighth protrusion 512*a* and the ninth protrusion 512*b* may be formed on the third plate 511, respectively. The eighth protrusion 512*a* and the ninth protrusion 512*b* may be protruded from the third plate 511, respectively. The eighth protrusion 512*a* and the ninth protrusion 512*b* may be disposed, being spaced apart from each other.

The field insulating film 105 may be formed on the third thermal conduction layer 510. The field insulating film 105 may at least partially cover the sidewalls of the eighth protrusion 512*a* and the ninth protrusion 512*b*.

The fifth wire pattern 520 may be formed on the third thermal conduction layer 510. The fifth wire pattern 520 may be formed on the field insulating film 105.

The fifth wire pattern 520 may be formed, being spaced apart from the field insulating film 105 and extending in a fifth direction X3.

The fifth wire pattern 520 may be disposed parallel to the upper surface of the substrate 100. The fifth wire pattern 520 may be laid on X3-Y3 plane.

The fifth wire pattern 520 may include a first end 520*a* and a second end 520*b* corresponding to each other. The first end 520*a* of the fifth wire pattern and the second end 520*b* of the fifth wire pattern may be positioned along the fifth direction X3.

The fifth wire pattern 520 may be positioned between the eighth protrusion 512*a* and the ninth protrusion 512*b*. As illustrated in FIG. 19, the fifth wire pattern 520 may not extend above the eighth protrusion 512*a* and the eighth protrusion 512*a*, although example embodiments are not limited thereto.

The seventh semiconductor pattern 540 may be formed on the third thermal conduction layer 510. The seventh semiconductor pattern 540 may contact the first end 520*a* of the fifth wire pattern and the third thermal conduction layer 510.

More specifically, the seventh semiconductor pattern 540 may be formed on the eighth protrusion 512*a*. The seventh semiconductor pattern 540 may contact the eighth protrusion 512*a*.

The eighth semiconductor pattern 545 may be formed on the third thermal conduction layer 510. The eighth semiconductor pattern 545 may be formed, being spaced apart from the seventh semiconductor pattern 540. The eighth semiconductor pattern 545 may contact the second end 520*b* of the fifth wire pattern and the third thermal conduction layer 510.

More specifically, the eighth semiconductor pattern 545 may be formed on the ninth protrusion 512*b*. The eighth semiconductor pattern 550 may contact the ninth protrusion 512*b*.

The fifth wire pattern 520 may be formed between the seventh semiconductor pattern 540 and the eighth semiconductor pattern 545.

The seventh semiconductor pattern 540 and the eighth semiconductor pattern 545 may be included in a source region and a drain region of the second transistor 501 of the semiconductor device 9 according to the ninth example embodiment.

The fourth gate electrode 530 may be formed, extending in a sixth direction Y3 and intersecting the fifth wire pattern 520. The fourth gate electrode 530 may surround the periphery of the fifth wire pattern 520, between the seventh semiconductor pattern 540 and the eighth semiconductor pattern 545.

Referring to FIG. 20, the concentration of impurity contained in the fourth wire pattern 420 may be higher than the concentration of impurity contained in the second thermal conduction layer 410 and the concentration of impurity contained in the substrate 100. The concentration of impurity contained in the second thermal conduction layer 410 may be different from the concentration of impurity contained in the substrate 100.

Further, the concentration of impurity contained in the fifth wire pattern 520 may be higher than the concentration of impurity contained in the third thermal conduction layer 510 and the concentration of impurity contained in the substrate 100. The concentration of impurity contained in the third thermal conduction layer 510 may be different from the concentration of impurity contained in the substrate 100.

Further, in the semiconductor device 9 according to the ninth example embodiment, the concentration profile of the impurity contained in the second thermal conduction layer 410 may be different from the concentration profile of the impurity contained in the third thermal conduction layer 510.

The expression, "concentration profile is different," used herein may refer to not only simple size differences of the impurity concentration, but also different types of the impurities as contained. Further, the expression, "concentration profile is different," used herein may also refer to possibility that the impurities contained in the thermal conduction layer have different distribution patterns (see FIGS. 7 to 10).

For example, the concentration of impurity contained in the second thermal conduction layer 410 may be constant in the thickness direction of the second thermal conduction layer 410, and the concentration of impurity contained in the third thermal conduction layer 510 may be constant in the thickness direction of the third thermal conduction layer 510.

Herein, considering that PMOS may be weaker against heat than NMOS is, the concentration of impurity contained in the third thermal conduction layer 510 may be set to be lower than the concentration of impurity contained in the second thermal conduction layer 410. By doing so, the thermal conductivity of the third thermal conduction layer 510 may be set to be higher than the thermal conductivity of the second thermal conduction layer 410.

Note that the shapes of the concentration of impurity contained in the second thermal conduction layer 410 and the concentration of impurity contained in the third thermal conduction layer 510 as illustrated in FIG. 5 are provided only for illustrative purpose, and the example embodiments are not limited thereto. It is of course possible that the concentration profile of the impurity contained in the second thermal conduction layer 410 and the concentration profile of the impurity contained in the third thermal conduction layer 510 may have the shapes as illustrated in FIGS. 5 to 10, respectively.

Further, the second thermal conduction layer 410 and the third thermal conduction layer 510 may contain different materials from each other.

FIGS. 21 to 31B are views illustrating intermediate stages of fabrication, provided to explain a method for fabricating a semiconductor device according to an example embodiment. FIGS. 22A, 23A, 24A, 25A, 26A, 27A, 28A, 29A, 30A and 31A are cross sectional views taken on line A-A of FIG. 21. FIGS. 22B, 23B, 24B, 25B, 26B, 27B, 28B, 29B, 30B and 31B are cross sectional views taken on line B-B of FIG. 21.

As a result, the semiconductor devices 1 to 4*a* according to the first to the fourth example embodiments may be fabricated.

Figure 21:
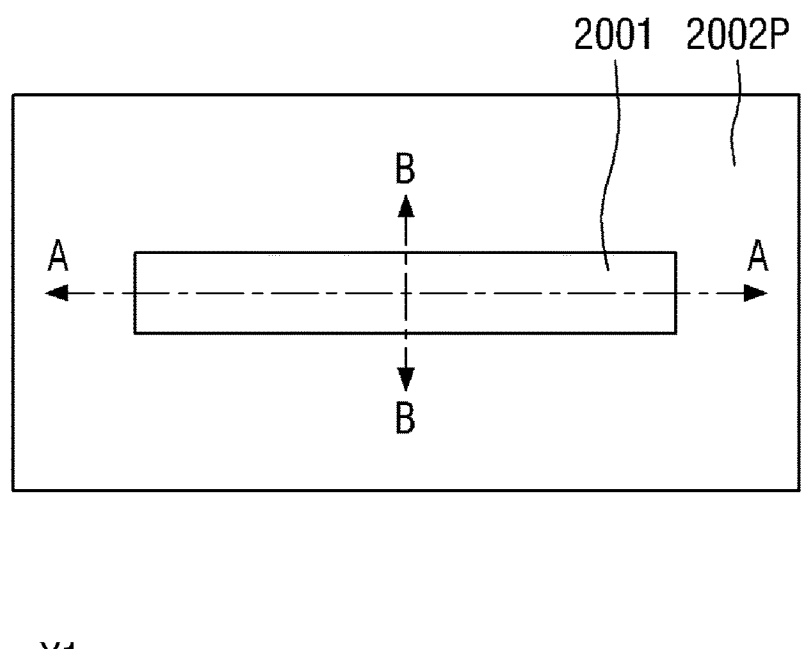
FIGS. 21 to 31B are views illustrating intermediate stages of fabrication, provided to explain a method for fabricating a semiconductor device according to an example embodiment.
Figure 22A:
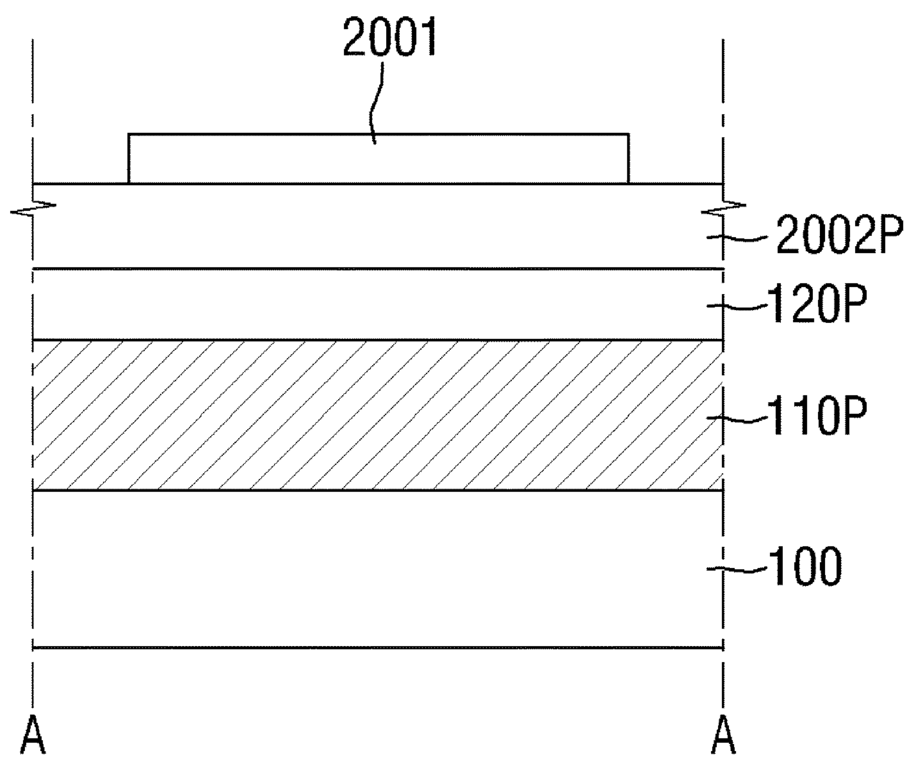
Figure 22B:
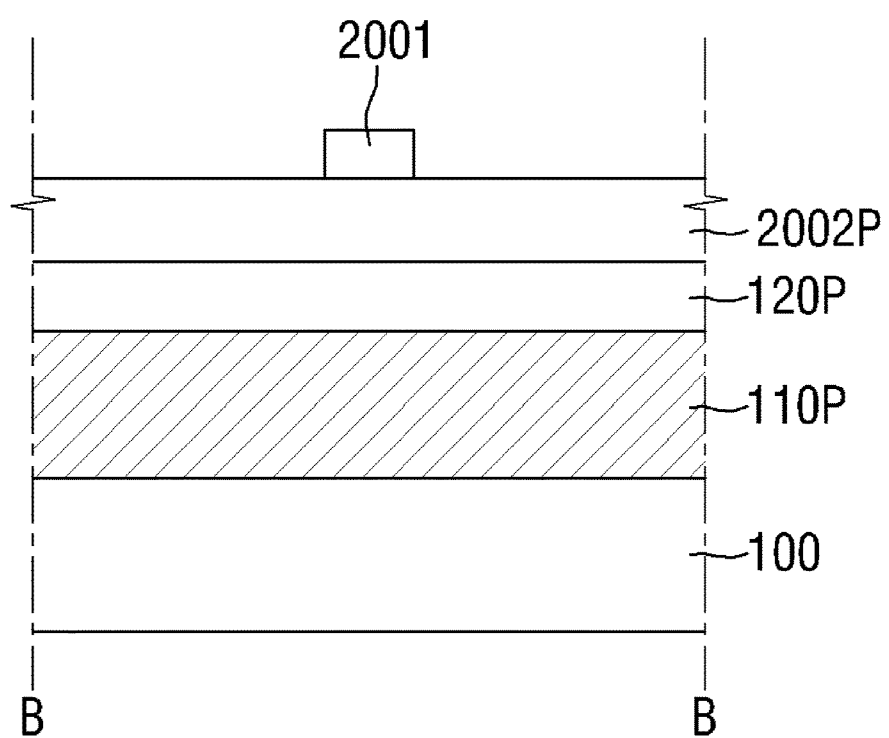

Referring to FIGS. 21 to 22B, a pre-thermal conduction layer 110P, a semiconductor film 120P, and a first mask film 2002P may be formed in sequence on the substrate 100.

A first mask pattern 2001 may be formed on the first mask film 2002P and extend in the first direction X1. The first mask film 2002P and the first mask pattern 2001 may include at least one of silicon oxide, silicon oxynitride, or silicon nitride.

The impurity contained in the pre-thermal conduction layer 110P may have the impurity profile as that of the first thermal conduction layer 110 described above with reference to FIGS. 5 to 10.

It is assumed herein that the pre-thermal conduction layer 110P and the semiconductor film 120P contain silicon, for example.

Figure 23A:
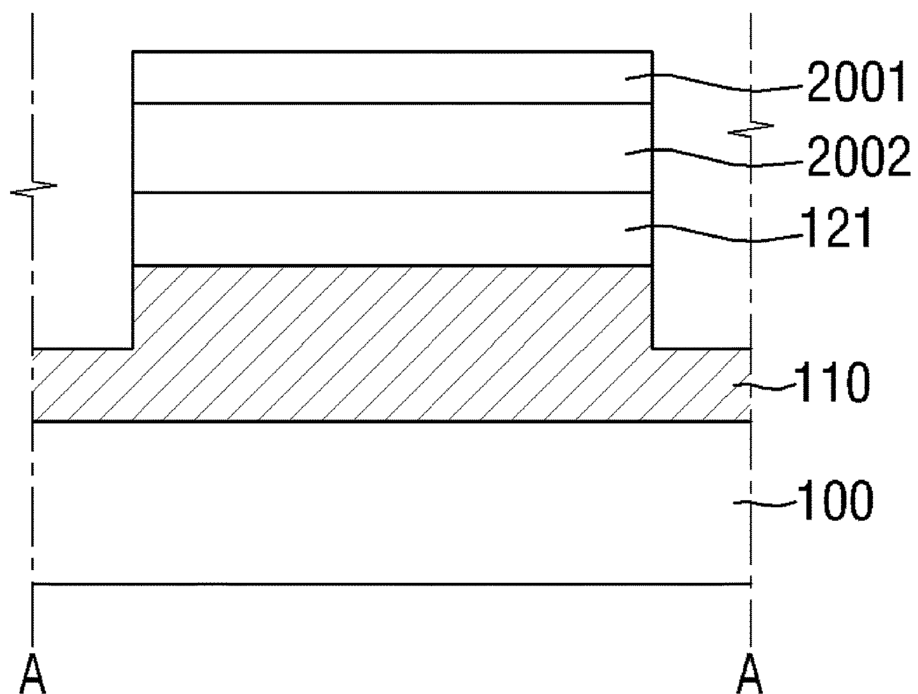
Figure 23B:
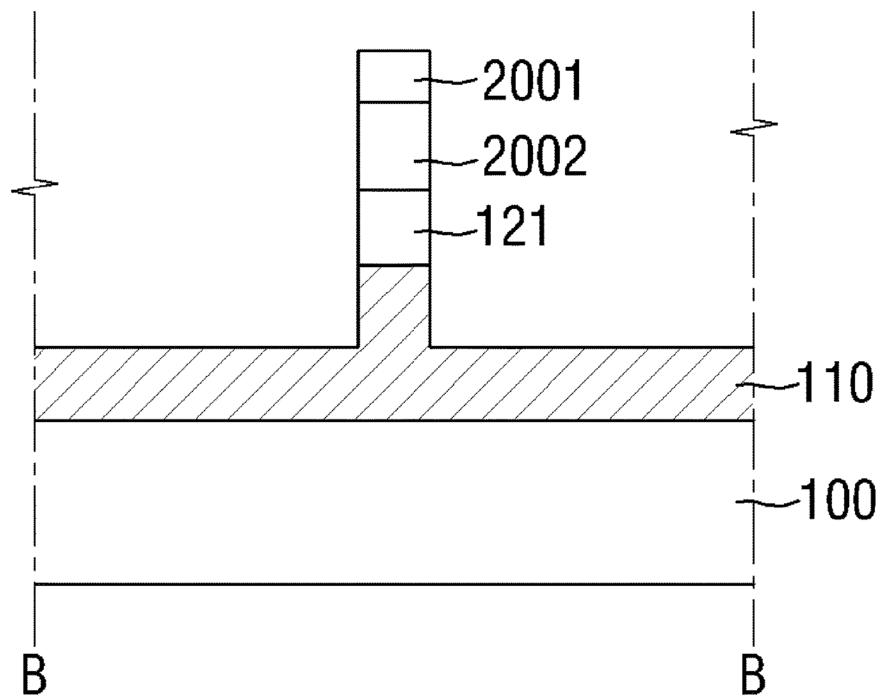

Referring to FIGS. 23A and 23B, a portion of the pre-thermal conduction layer 110P, the first semiconductor film 120P, and the first mask film 2002P may be patterned, using the first mask pattern 2001.

As a result, the first thermal conduction layer 110, the channel pattern 121 and the second mask pattern 2002, which are stacked on one another in sequence, may be formed on the substrate 100.

Figure 24A:
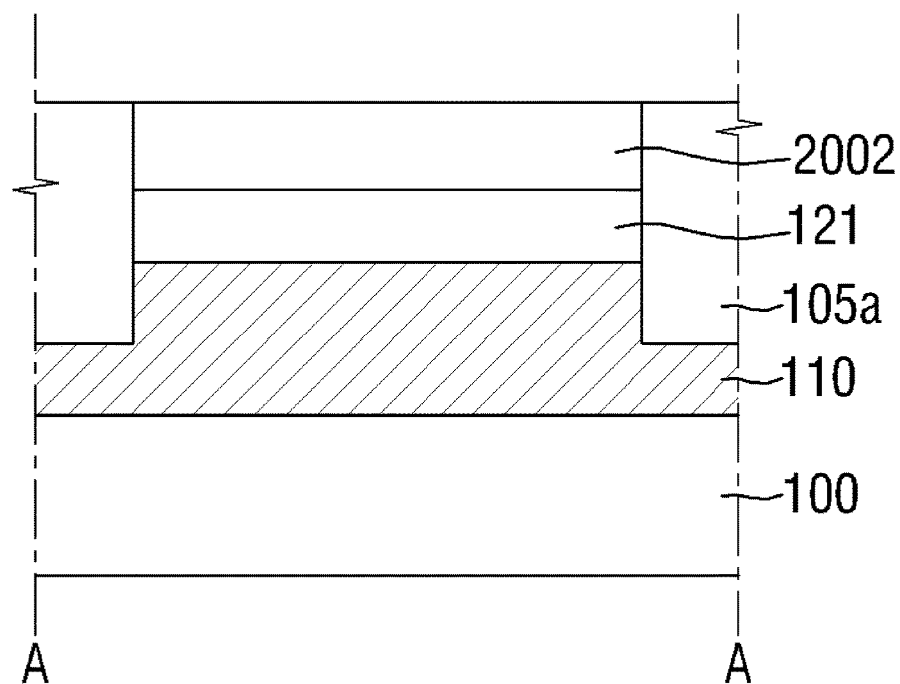
Figure 24B:
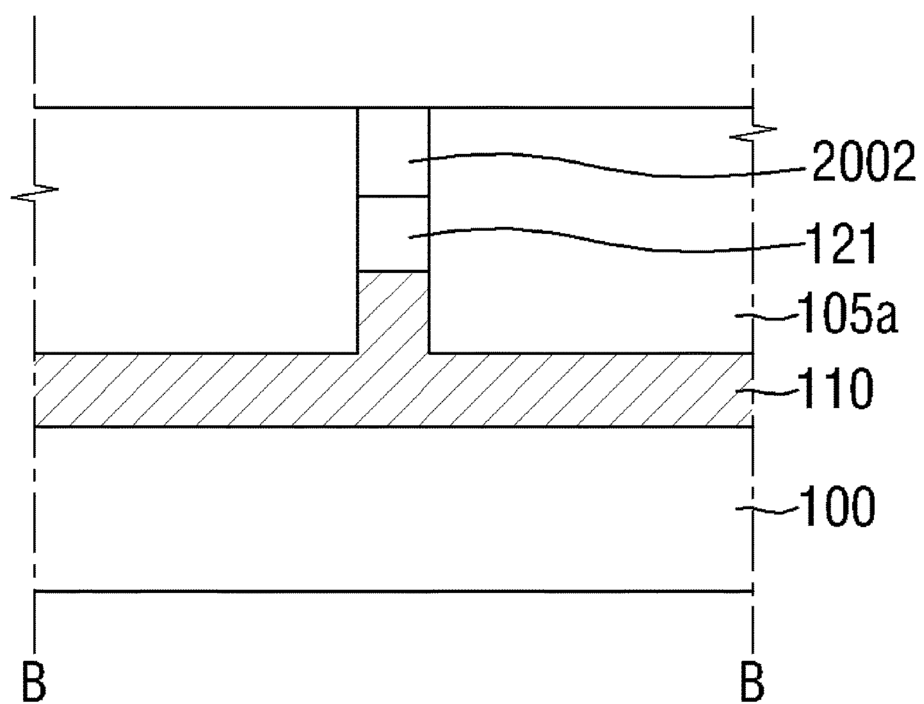

Referring to FIGS. 24A and 24B, the first pre-field insulating film 105*a* may be formed on the first thermal conduction layer 110.

The first pre-field insulating film 105*a* covering the first mask pattern 2001 may be formed. The second mask pattern 2002 may then be exposed by planarization of the first pre-field insulating film 105*a*. At this time, the first mask pattern 2001 on the second mask pattern 2002 may be removed.

Figure 25A:
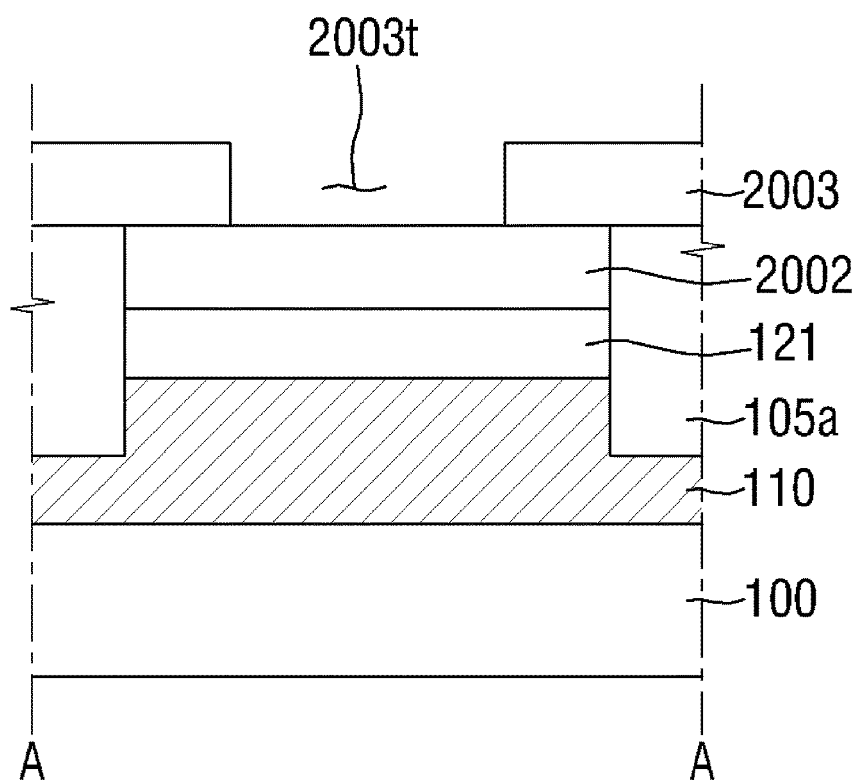
Figure 25B:
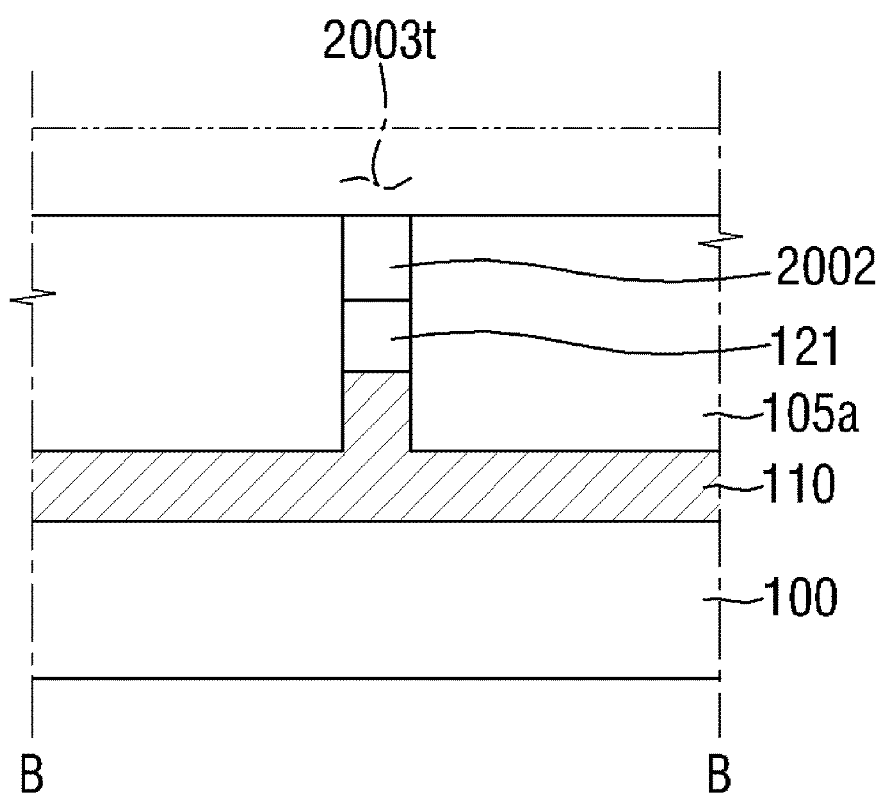

Referring to FIGS. 25A and 25B, the third mask pattern 2003 may be formed on the first thermal conduction layer 110 and the first pre-field insulating film 105*a*.

The third mask pattern 2003 may include an opening 2003*t* partially overlapping with the channel pattern 121.

A portion of the second mask pattern 2002 may be exposed by the opening 2003*t*.

The third mask pattern 2003 may include at least one of silicon oxide, silicon oxynitride, or silicon nitride, for example.

Figure 26A:
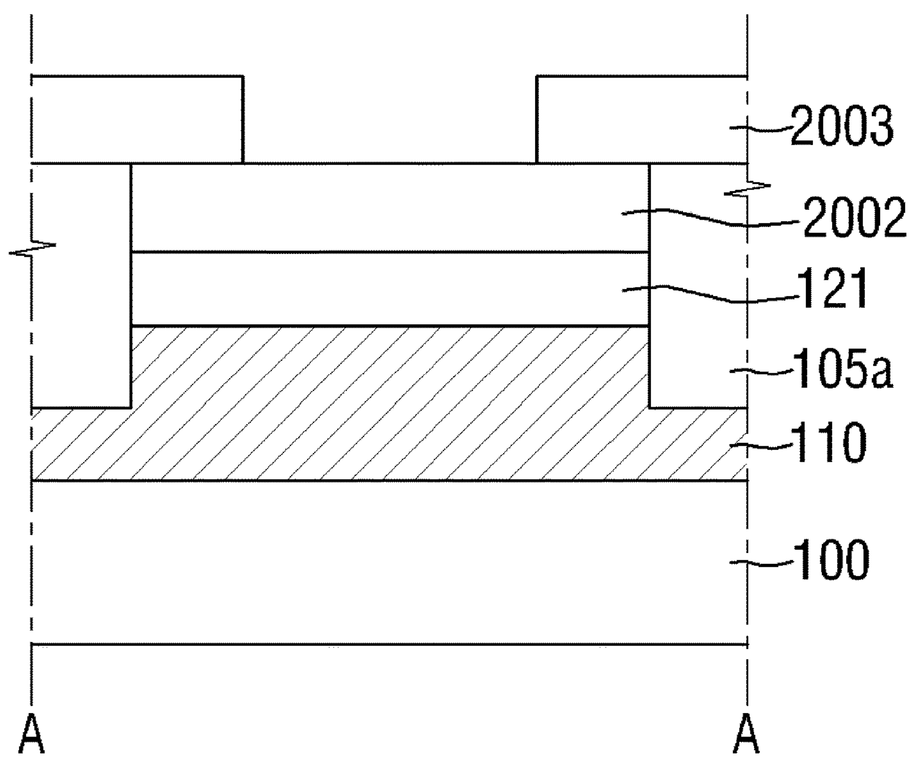
Figure 26B:
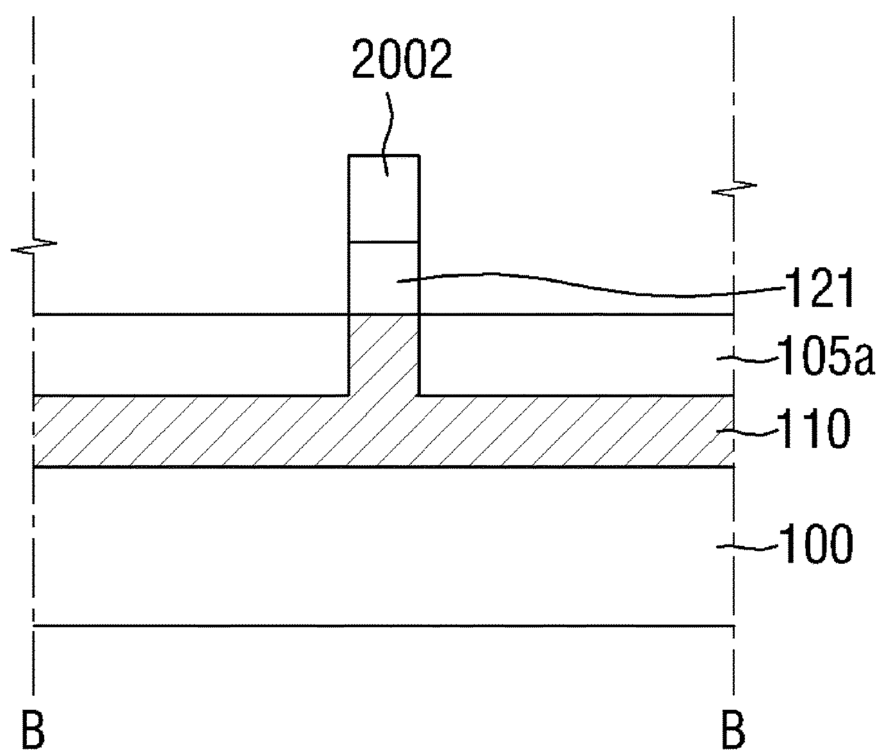

Referring to FIGS. 26A and 26B, a portion of the first pre-field insulating film 105*a* may be recessed, using the third mask pattern 2003.

Referring to FIG. 26B, the channel pattern 121 may be exposed, as the portion of the first pre-field insulating film 105*a* is recessed.

Figure 27A:
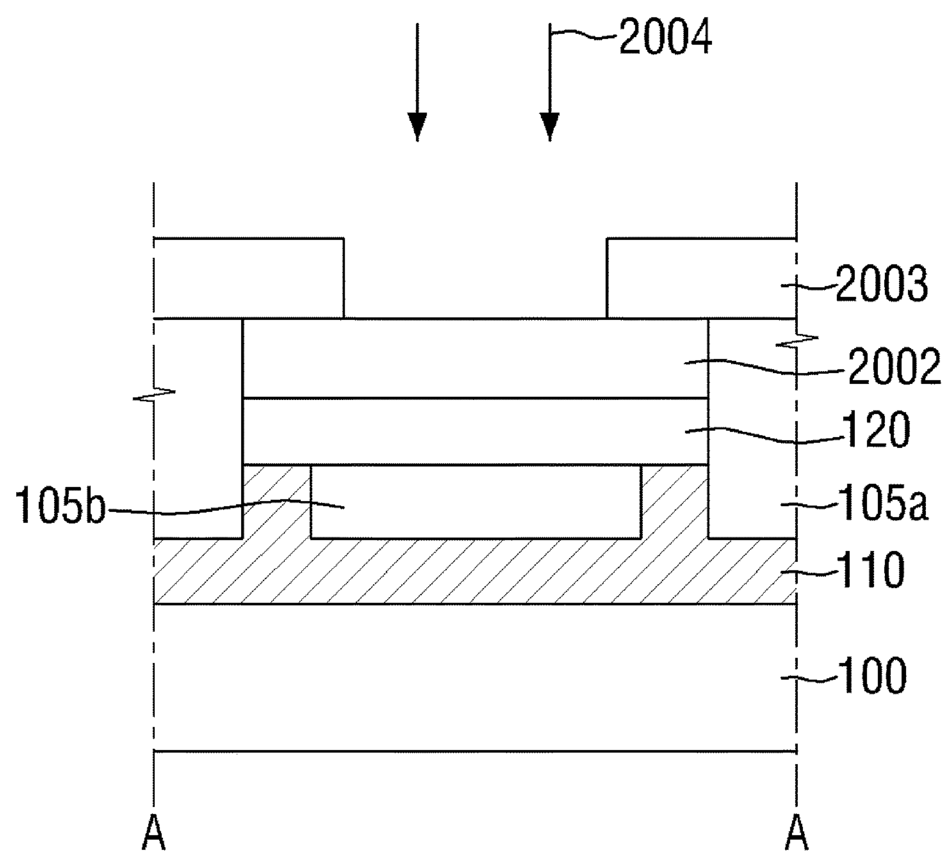
Figure 27B:
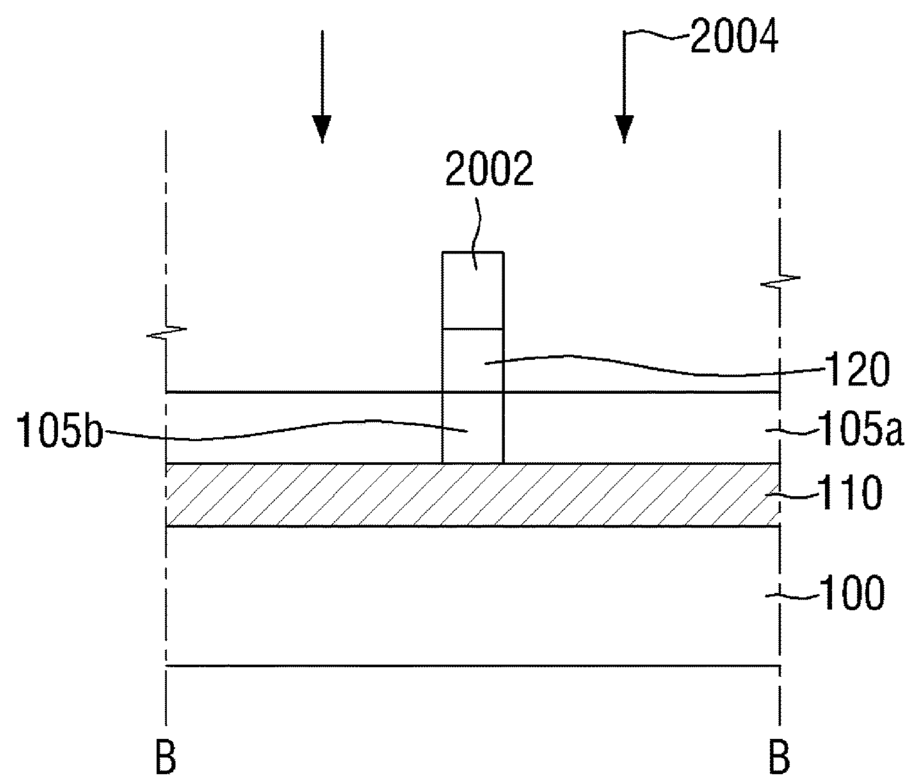

Referring to FIGS. 27A and 27B, a portion of the first thermal conduction layer 110 under the channel pattern 121 may be oxidized, using the second mask pattern 2002 and the third mask pattern 2003. By doing so, the second pre-field insulating film 105*b* may be formed under the channel pattern 121.

Forming the second pre-field insulating film 105*b* may use directional impurity doping such as ion implantation or plasma assisted doping (PLAD), for example.

The impurity provided by the directional impurity doping 2004 is the impurity that can be bound to the first thermal conduction layer 110 to form an insulating film pattern. For example, the impurity that can be bound to the first thermal conduction layer 110 to form an insulating film pattern may be oxygen or nitrogen, although not limited thereto.

For example, as oxygen is provided to an upper portion of the first thermal conduction layer 110 through the directional impurity doping 2004, the upper portion of the first thermal conduction layer 110 contacting the channel pattern 121 may be oxidized. As a result, the second pre-field insulating film 105*b*, which is an insulating film pattern, is formed between the channel pattern 121 and the first thermal conduction layer 110.

The impurity provided from the directional impurity doping 2004 can be diffused in a lateral direction, partially oxidizing the first thermal conduction layer 110, because the advancing path can change due to collision with the first pre-field insulating film 105*a*.

The channel pattern 121 may become the first wire pattern 120, as the second pre-field insulating film 105*b* is formed.

Figure 28A:
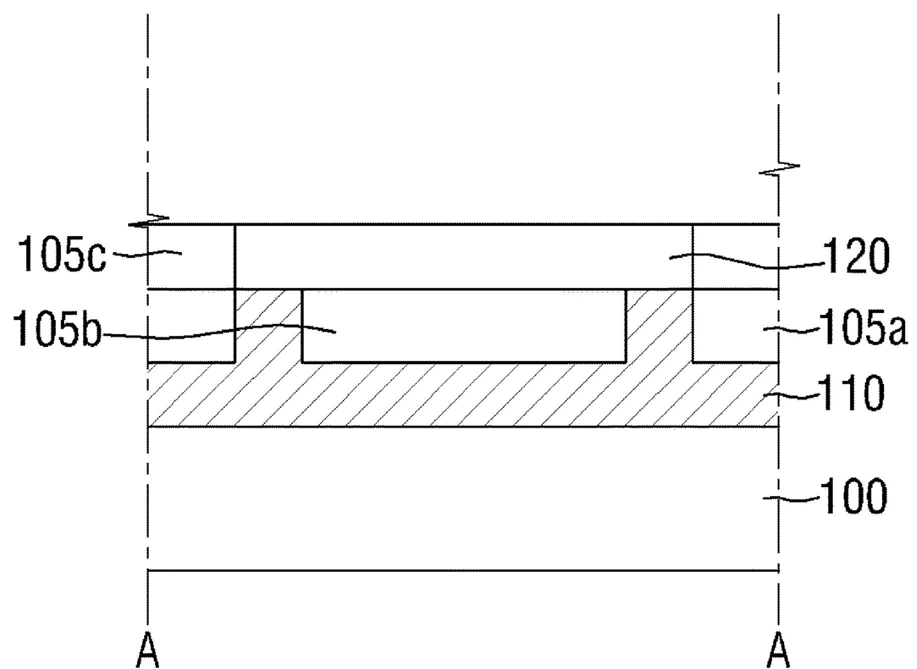
Figure 28B:
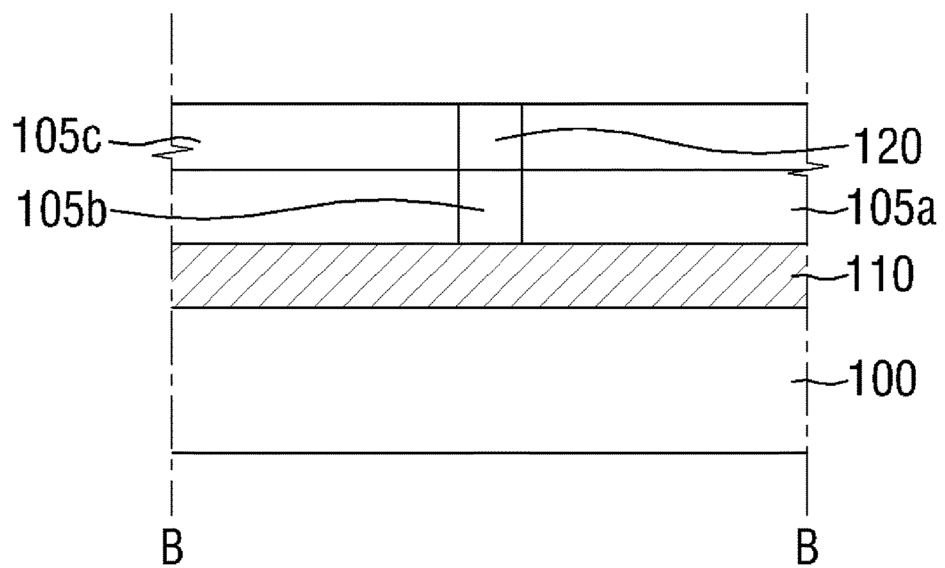

Referring to FIGS. 28A and 28B, the third pre-field insulating film 105*c* may be formed on the first pre-field insulating film 105*a*, covering the first wire pattern 120.

The first wire pattern 120 may then be exposed by planarization of the third pre-field insulating film 105*c*. The second mask pattern 2002 and the third mask pattern 2003 may be removed when the third pre-field insulating film 105*c* is planarized.

Figure 29A:
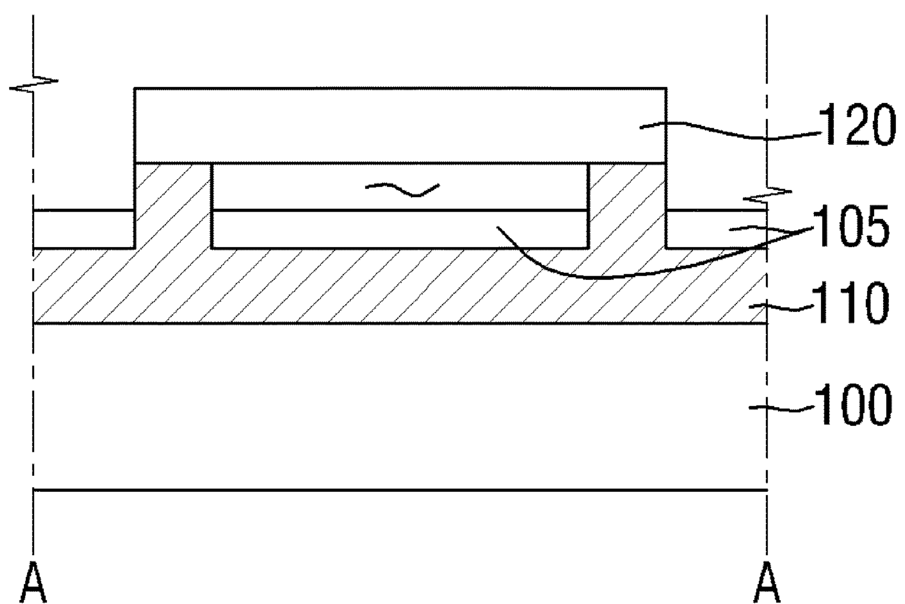
Figure 29B:
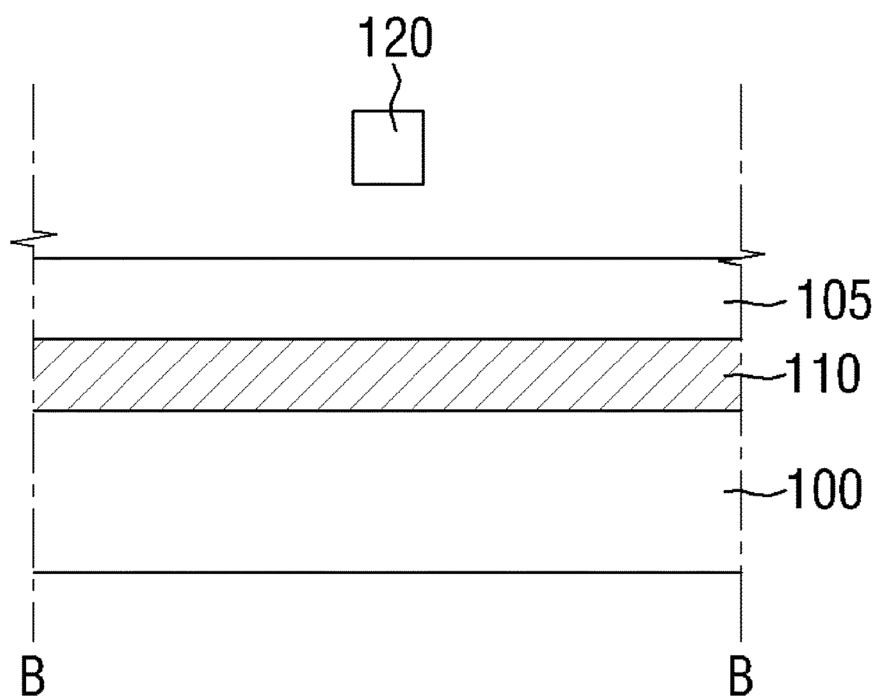

Referring to FIGS. 29A and 29B, a portion of the first pre-field insulating film 105*a*, a portion of the second pre-field insulating film 105*b*, and the third pre-field insulating film 105*c* may be removed to form the first wire pattern 120 spaced apart from the upper surface of the second pre-field insulating film 105*b*.

Further, a portion of the first pre-field insulating film 105*a*, a portion of the second pre-field insulating film 105*b*, and the third pre-field insulating film 105*c* may be removed to form the field insulating film 105 on the first thermal conduction layer 110.

Figure 30A:
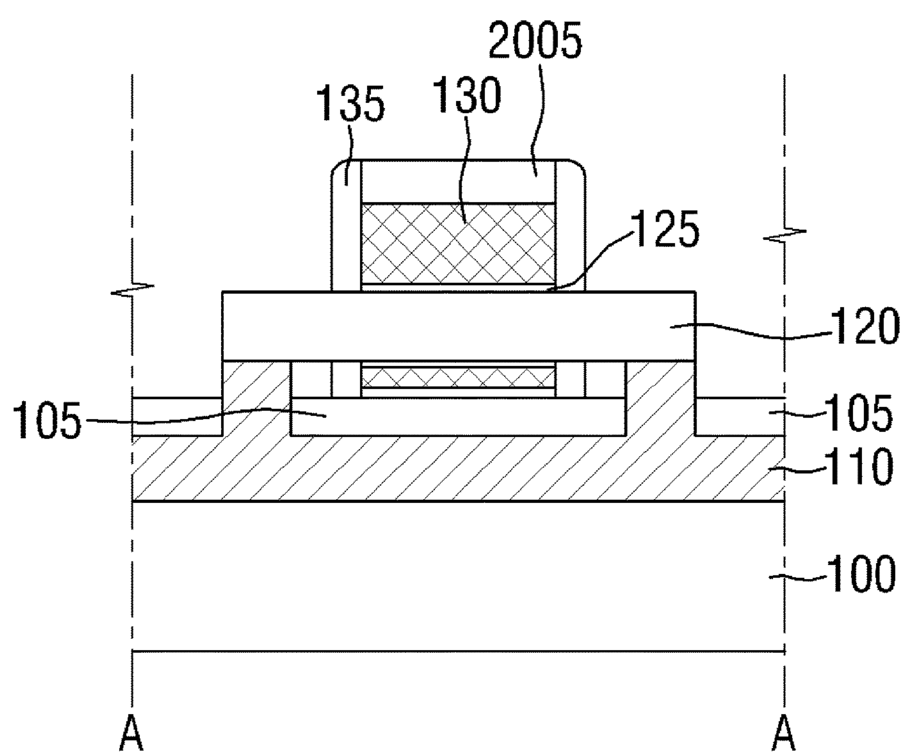
Figure 30B:
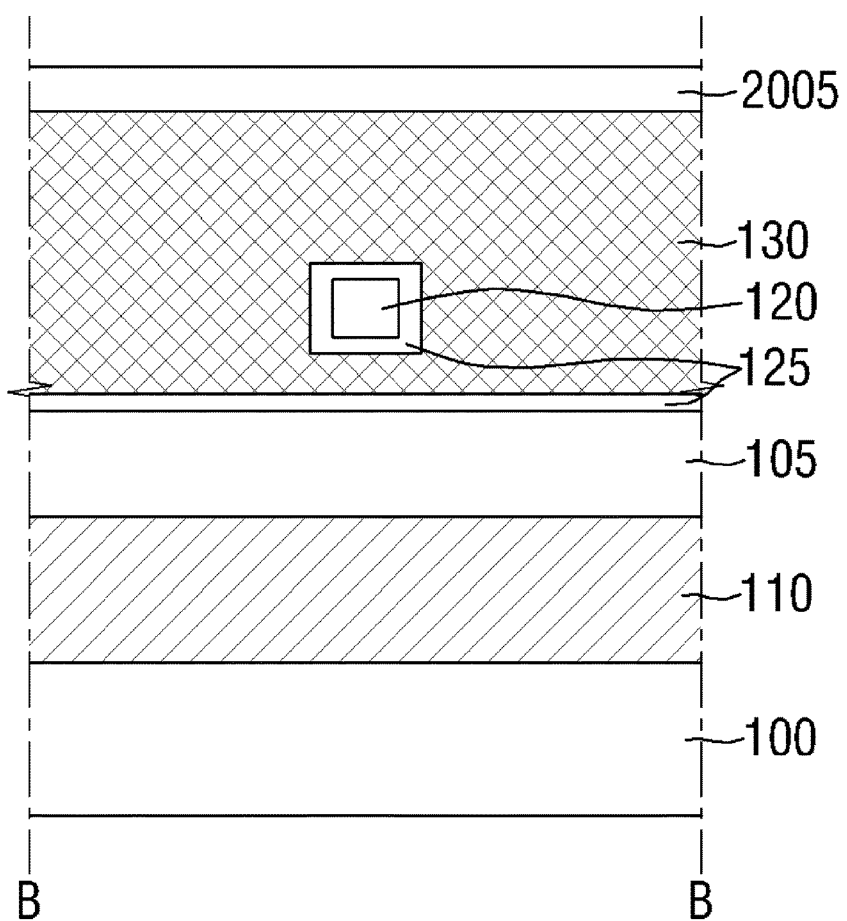

Referring to FIGS. 30A and 30B, the first gate insulating film 125 may be formed, along the periphery of the first wire pattern 120. Further, the first gate electrode 130 may be formed, surrounding the periphery of the first wire pattern 120.

The first gate electrode 130 may be formed by using the fourth mask pattern 2005 formed on the first gate electrode 130.

The first spacer 135 may then be formed on the sidewall of the first gate electrode 130.

Figure 31A:
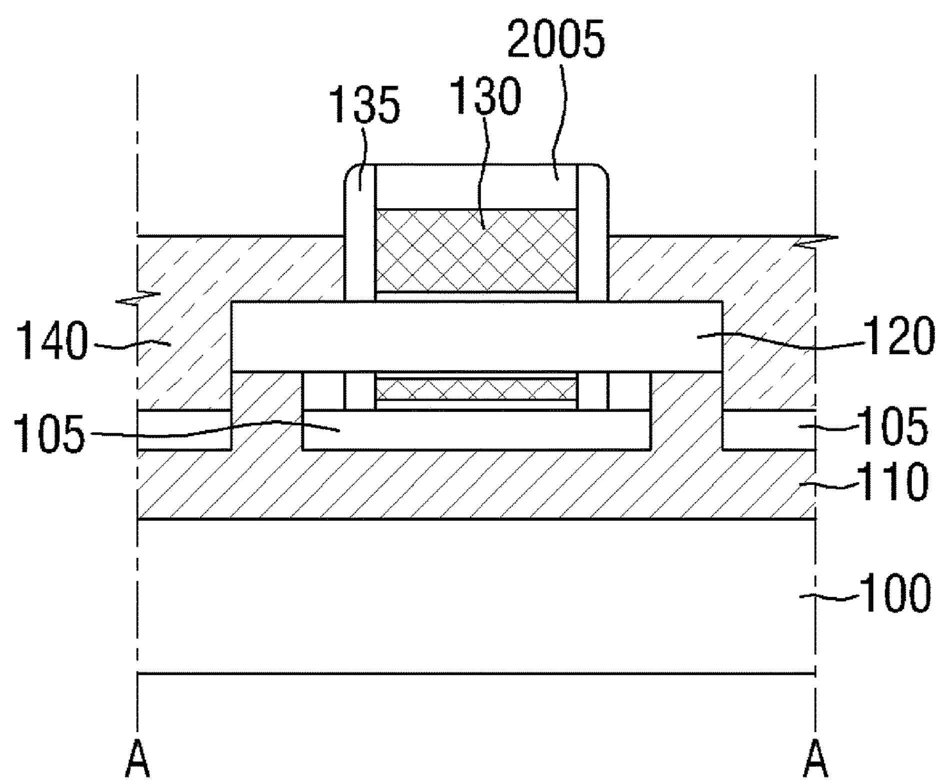
Figure 31B:
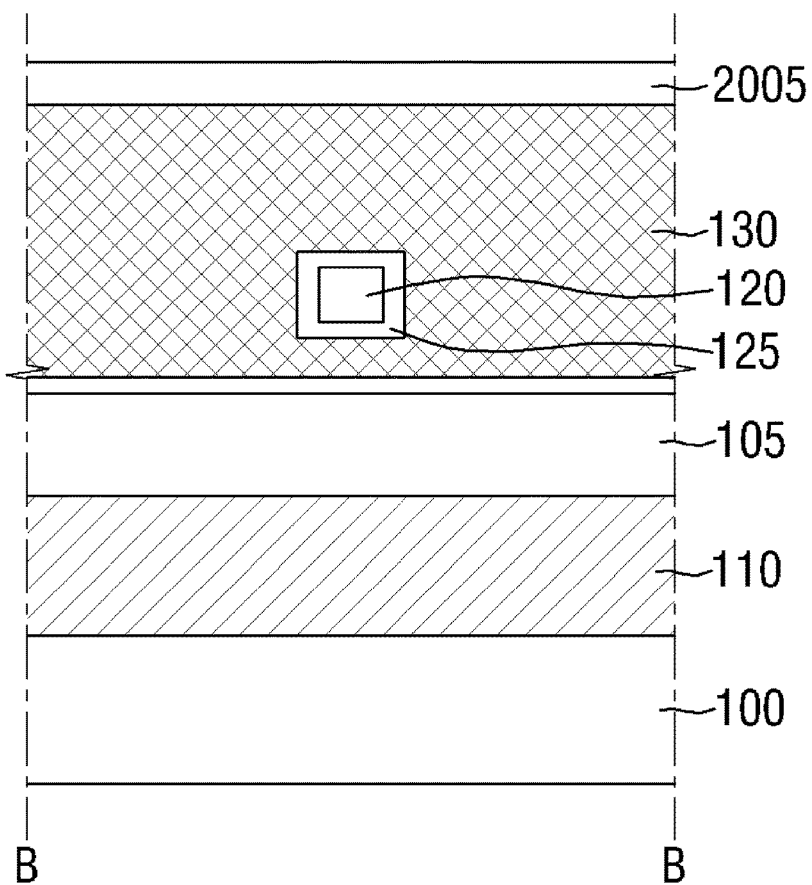

Referring to FIGS. 31A and 31B, at least a portion of the first wire pattern 120 protruding from the first spacer 135 may be removed. At this time, a portion of the first thermal conduction layer 110, which is protruded above the upper surface of the field insulating film 105, may also be removed.

Next, the first semiconductor pattern 140 and the second semiconductor pattern 145, which contact the first thermal conduction layer 110 and the first wire pattern 120, may be formed on the first thermal conduction layer 110.

Figure 32:
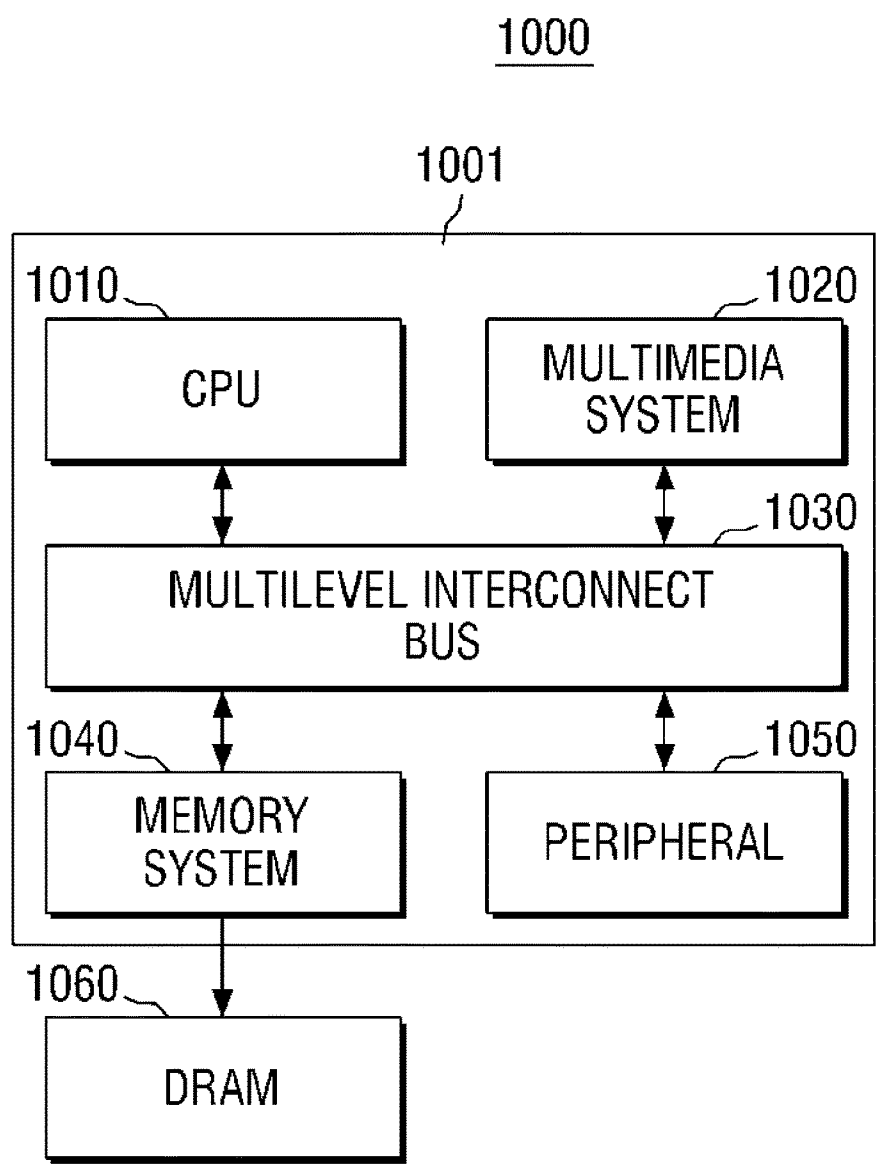
FIG. 32 is a block diagram of an SoC system comprising a semiconductor device according to example embodiments.

FIG. 32 is a block diagram of an SoC system comprising a semiconductor device according to example embodiments.

Referring to FIG. 32, the SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform an arithmetic operation necessary for driving of the SoC system 1000. In some example embodiments, the CPU 1010 may be configured on a multi-core environment which includes a plurality of cores.

The multimedia system 1020 may be used for performing a variety of multimedia functions on the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some example embodiments, the bus 1030 may have a multi-layer structure. Specifically, an example of the bus 1030 may be a multi-layer advanced high-performance bus (AHB), or a multi-layer advanced eXtensible interface (AXI), although example embodiments are not limited herein.

The memory system 1040 may provide environments necessary for the application processor 1001 to connect to an external memory (e.g., DRAM 1060) and to perform high-speed operation. In some example embodiments, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow a compatible operation with the external device connected to the SoC system 1000.

The DRAM 1060 may function as an operation memory necessary for the operation of the application processor 1001. In some example embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the example embodiments explained above.

Figure 33:
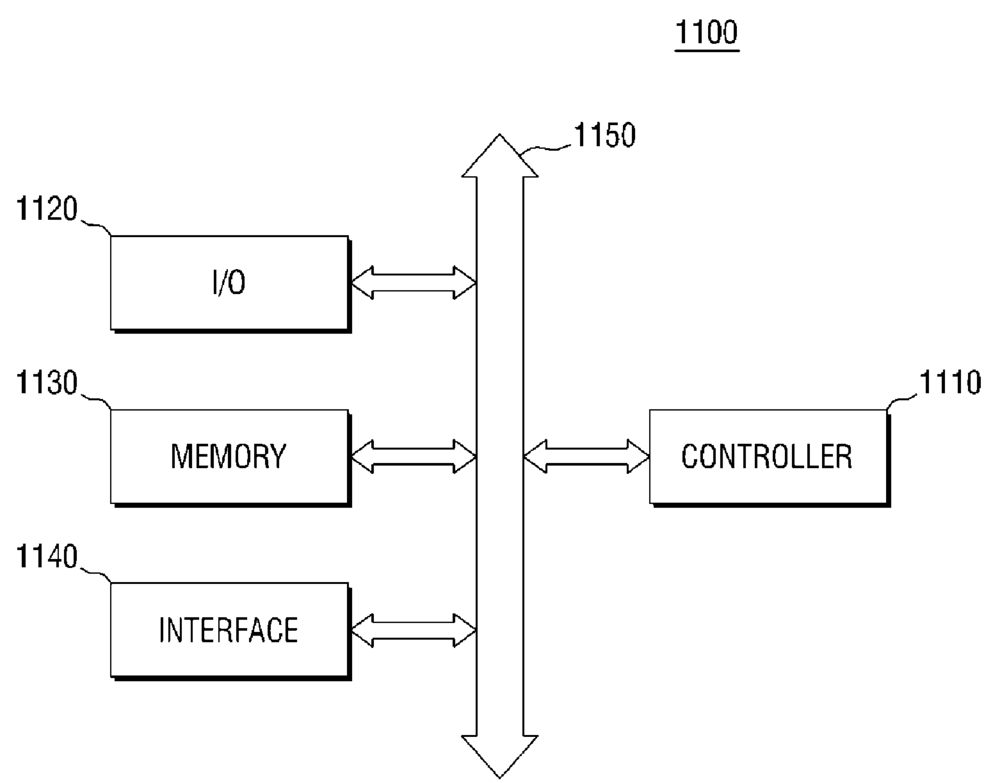
FIG. 33 is a block diagram of an electronic system comprising a semiconductor device according to example embodiments.

FIG. 33 is a block diagram of an electronic system comprising a semiconductor device according to example embodiments.

Referring to FIG. 33, the electronic system 1100 according to an example embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of a microprocessor, a digital signal process, a micro controller or a logic device capable of performing functions similar to those mentioned above. The I/O device 1120 may include a keypad, a keyboard or a display device. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance an operation of the controller 1110, such as a high-speed dynamic random-access memory (DRAM) and/or a static random access memory (SRAM).

According to the example embodiments described above, the semiconductor device may be provided within the memory device 1130, or provided as a part of the controller 1110 or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 34:
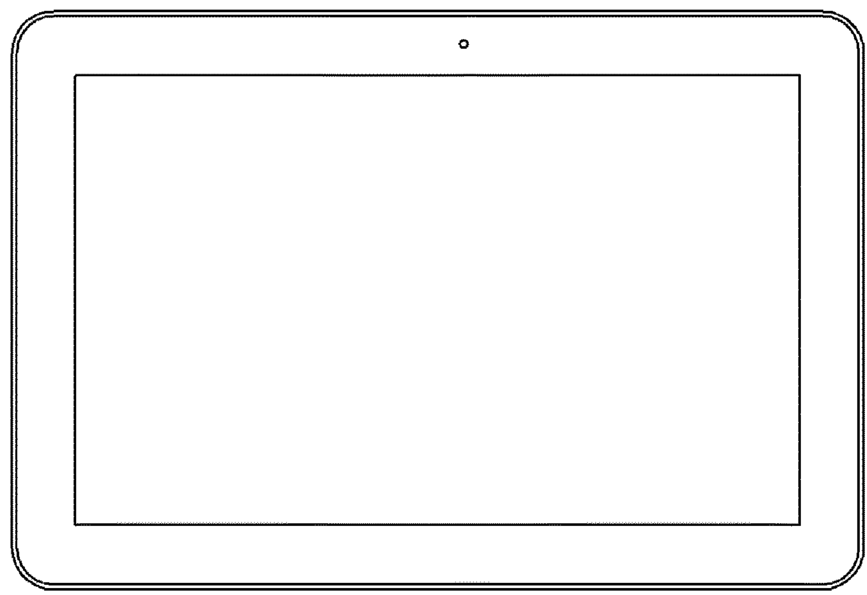
FIGS. 34 to 36 illustrate example semiconductor systems which may apply therein a semiconductor device according to example embodiments.
Figure 35:
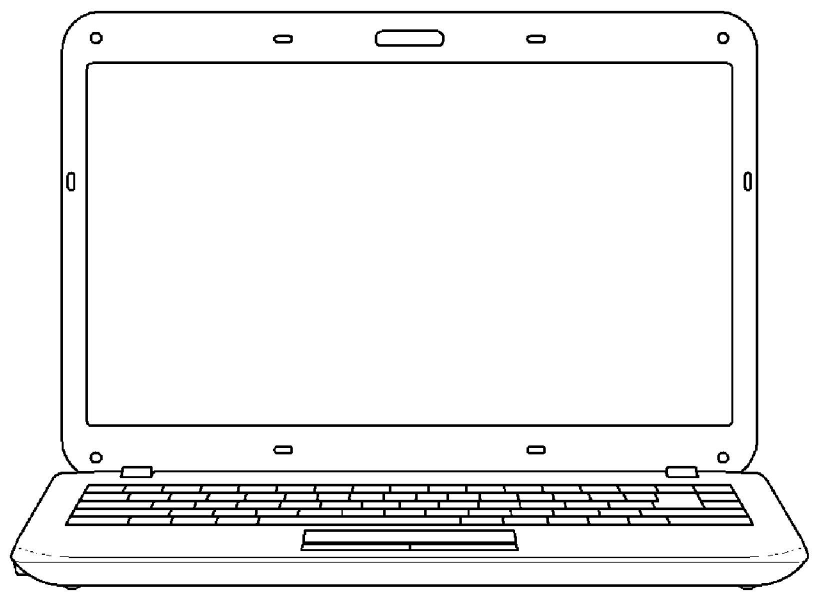
Figure 36:
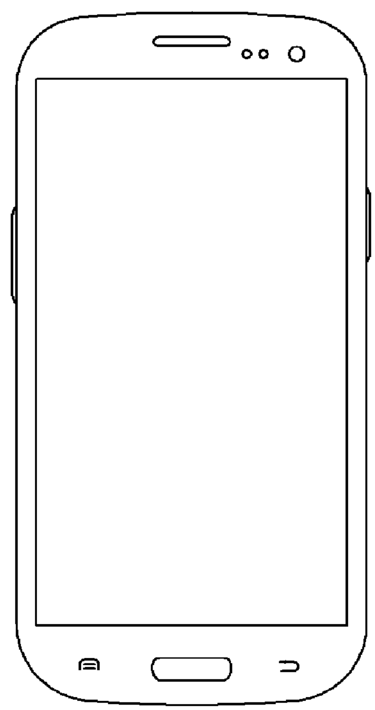

FIGS. 34 to 36 illustrate example semiconductor systems which may apply therein a semiconductor device according to example embodiments.

FIG. 34 illustrates a tablet PC 1200, FIG. 35 illustrates a laptop computer 1300, and FIG. 36 illustrates a smartphone 1400. According to the example embodiments explained above, the semiconductor device may be used in these devices, i.e., in the tablet PC 1200, the laptop computer 1300 or the smartphone 1400.

Further, it is apparent to those skilled in the art that the semiconductor device according to example embodiments described above is applicable to another integrated circuit device not illustrated herein.

That is, while the tablet PC 1200, the laptop computer 1300 and the smartphone 1400 are exemplified herein as a semiconductor system according to the example embodiments, the example embodiments of the semiconductor system are not limited to any of the examples given above.

In some example embodiments, the semiconductor system may be realized as a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, or a digital video player.

The embodiments of the present disclosure have been described with reference to the attached drawings, but it may be understood by one of ordinary skill in the art that the present inventive concept may be performed one of ordinary skill in the art in other specific forms without changing the technical concept or essential features of the present inventive concept. Further, the above-described embodiments are merely examples and do not limit the scope of the rights of the present inventive concept.

What is claimed is:

1. A semiconductor device, comprising:

a substrate;

a thermal conduction layer on the substrate, the thermal conduction layer being a semiconductor layer having a concentration of impurity that is different from a concentration of impurity of the substrate, wherein the concentration of impurity contained in the thermal conduction layer increases in a direction farther away from the substrate, wherein the thermal conduction layer is of a p-type or n-type semiconductor layer;

a first wire pattern on the thermal conduction layer, the first wire pattern comprising a first end and a second end, a concentration of impurity contained in the first wire pattern being higher than the concentration of impurity contained in the substrate;

a first semiconductor pattern contacting the first end of the first wire pattern and the thermal conduction layer;

a second semiconductor pattern contacting the second end of the first wire pattern; and a gate electrode between the first semiconductor pattern and the second semiconductor pattern, the gate electrode surrounding a periphery of the first wire pattern.

2. The semiconductor device of claim 1, wherein the thermal conduction layer comprises a plate and a protrusion protruding from the plate, and the first semiconductor pattern is in contact with the protrusion.

3. The semiconductor device of claim 2, further comprising a field insulating film formed on the thermal conduction layer, wherein the field insulating film surrounds at least a portion of a sidewall of the protrusion.

4. The semiconductor device of claim 1, wherein the concentration of impurity contained in the thermal conduction layer is higher than the concentration of impurity contained in the substrate.

5. The semiconductor device of claim 1, wherein the concentration of impurity contained in the thermal conduction layer is varied in a thickness direction of the thermal conduction layer.

6. The semiconductor device of claim 1, wherein the thermal conduction layer comprises a portion having a lower concentration of impurity than the substrate.

7. The semiconductor device of claim 1, wherein the first wire pattern is disposed parallel to an upper surface of the substrate, and the second semiconductor pattern is in contact with the thermal conduction layer.

8. The semiconductor device of claim 1, wherein the first wire pattern is disposed perpendicular to an upper surface of the substrate, the first semiconductor pattern is disposed between the first wire pattern and the thermal conduction layer, and the second semiconductor pattern is disposed on the second end of the first wire pattern.

9. The semiconductor device of claim 1, further comprising a second wire pattern on the thermal conduction layer, wherein the second wire pattern comprises a third end and a fourth end, the second wire pattern is abreast with the first wire pattern, and the gate electrode surrounds a periphery of the second wire pattern.

10. The semiconductor device of claim 1, wherein the concentration of impurity contained in the first wire pattern is higher than the concentration of impurity contained in the thermal conduction layer.

11. A semiconductor device, comprising:

a substrate;

a thermal conduction layer on the substrate, the thermal conduction layer comprising a plate and a first protrusion protruding from the plate, the thermal conduction layer being a semiconductor layer having a concentration of impurity that is different from a concentration of impurity of the substrate, wherein the concentration of impurity contained in the thermal conduction layer increases in a direction farther away from the substrate, wherein the thermal conduction layer is of a p-type or n-type semiconductor layer;

a first semiconductor pattern on the thermal conduction layer, the first semiconductor pattern contacting the first protrusion;

a second semiconductor pattern on the thermal conduction layer, the second semiconductor pattern being spaced apart from the first semiconductor pattern;

a wire pattern between the first semiconductor pattern and the second semiconductor pattern, the wire pattern extending longitudinally from one direction, a concentration of impurity contained in the wire pattern being higher than the concentration of impurity contained in the thermal conduction layer and higher than the concentration of impurity contained in the substrate; and a gate electrode on the thermal conduction layer, the gate electrode surrounding a periphery of the wire pattern.

12. The semiconductor device of claim 11, wherein the thermal conduction layer further comprises a second protrusion protruding from the plate and being spaced apart from the first protrusion, and the second protrusion contacts the second semiconductor pattern.

13. The semiconductor device of claim 11, wherein the first semiconductor pattern, the wire pattern and the second semiconductor pattern are stacked in sequence on the first protrusion.

14. A semiconductor device, comprising: a substrate comprising a first region in which an NMOS is formed and a second region in which a PMOS is formed; a first transistor formed on the first region and comprising: a first thermal conduction layer on the substrate, wherein the concentration of impurity contained in the first thermal conduction layer increases in a direction farther away from the substrate, wherein the first thermal conduction layer is a n-type or p-type semiconductor layer having a concentration of impurity; a first wire pattern on the first thermal conduction layer and including a first end and a second end; a first semiconductor pattern contacting the first end of the first wire pattern and the first thermal conduction layer; a second semiconductor pattern contacting the second end of the first wire pattern; and a first gate electrode surrounding the first wire pattern; and a second transistor formed on the second region and comprising: a second thermal conduction layer on the substrate, wherein the second thermal conduction layer is a p-type or n-type semiconductor layer having a concentration of impurity; a second wire pattern on the second thermal conduction layer and including a third end and a fourth end; a third semiconductor pattern contacting the third end of the second wire pattern and the second thermal conduction layer; a fourth semiconductor pattern contacting the fourth end of the second wire pattern; and a second gate electrode surrounding the second wire pattern, wherein a concentration of impurity contained in the first wire pattern is higher than the concentration of impurity contained in the first thermal conduction layer and higher than a concentration of impurity contained in the substrate, wherein a concentration of impurity contained in the second wire pattern is higher than the concentration of impurity contained in the second thermal conduction layer and higher than the concentration of impurity contained in the substrate, and wherein a concentration profile of impurity contained in the first thermal conduction layer is different from a concentration profile of impurity contained in the second thermal conduction layer.

* * * * *